(12) United States Patent
McMorrow et al.

(10) Patent No.: US 7,002,428 B2
(45) Date of Patent: Feb. 21, 2006

(54) DIELECTRIC LOSS COMPENSATION METHODS AND APPARATUS

(75) Inventors: Norman S. McMorrow, Portland, OR (US); Robert C. Hinz, Jr., West Linn, OR (US)

(73) Assignee: Stilwell Baker, Inc. and SiQual, Inc., Tualatin, OR (US)

( * ) Notice: Subject to any disclaimer, the term of this patent is extended or adjusted under 35 U.S.C. 154(b) by 0 days.

(21) Appl. No.: 10/352,310

(22) Filed: Jan. 27, 2003

(65) Prior Publication Data

US 2003/0141942 A1    Jul. 31, 2003

Related U.S. Application Data

(60) Provisional application No. 60/352,618, filed on Jan. 28, 2002.

(51) Int. Cl.
*H04B 3/04*      (2006.01)
*H03H 7/03*      (2006.01)

(52) U.S. Cl. .................................. 333/20; 333/28 R
(58) Field of Classification Search .............. 333/20, 333/28 R, 185; 29/830
See application file for complete search history.

(56) References Cited

U.S. PATENT DOCUMENTS

| | | | |
|---|---|---|---|
| 5,640,761 A * | 6/1997 | DiStefano et al. ............. 29/830 |
| 5,804,921 A * | 9/1998 | McEwan et al. ............... 333/20 |
| 6,222,427 B1 | 4/2001 | Kato et al. | |
| 6,236,290 B1 | 5/2001 | Abe et al. | |
| 6,448,873 B1 * | 9/2002 | Mostov ........................ 333/185 |
| 6,480,728 B1 * | 11/2002 | Mansour ...................... 505/210 |
| 6,538,525 B1 * | 3/2003 | Williamson ................... 333/20 |

2003/0169121 A1 * 9/2003 Grebenkemper ............. 333/12

OTHER PUBLICATIONS

"2 mm Hard Metric Cable System," www.meritec.com (Nov., 2002).
"Equalized 2 mm Hard Metric Cable Assemblies," http://www.e-insite.net/ecnmag/index.asp?layout=articlePrint&articleID=CA258393 Nov. 15, 2002 (accessed Apr. 22, 2003).
"Extending the Life of the 2 mm HM Standard into Multigigabit Performance," www.ecnmag.com (Nov. 15, 2002).
"Meritec—Equalized 2 mm Hard Metric Cable Assemblies," http://www.meritec.com/Pages/products/cca/2mmhm.html 2 pages (accessed Mar. 20, 2003).
J. Sawdy et al., "Equalization of Meritec's 2 mm Hard Metric Cable Assemblies," pp. 1-10, Nov. 12, 2002.

* cited by examiner

*Primary Examiner*—Dean Takaoka
(74) *Attorney, Agent, or Firm*—Klarquist Sparkman, LLP

(57) ABSTRACT

Multilayer circuit boards include compensator networks configured in one or more conductor layers. A signal trace is configured in one or more layers to transmit an electrical signal from an input to an output and the compensator network is situated at at least one location on the trace to provide compensation for frequency dependent signal propagation losses or distortions such as those due to dielectric loss. In one example, the compensator includes a high frequency path provided by a series capacitance formed by conductor layers that include interleaved digits. Transmitters that include such compensators provide predistorted signals that can be matched or otherwise associated with anticipated propagation losses and distortions. Methods of evaluating dielectric losses include propagating electrical signals through such compensators and along a trace defined with respect to a dielectric under test and determining an associated compensation.

14 Claims, 18 Drawing Sheets

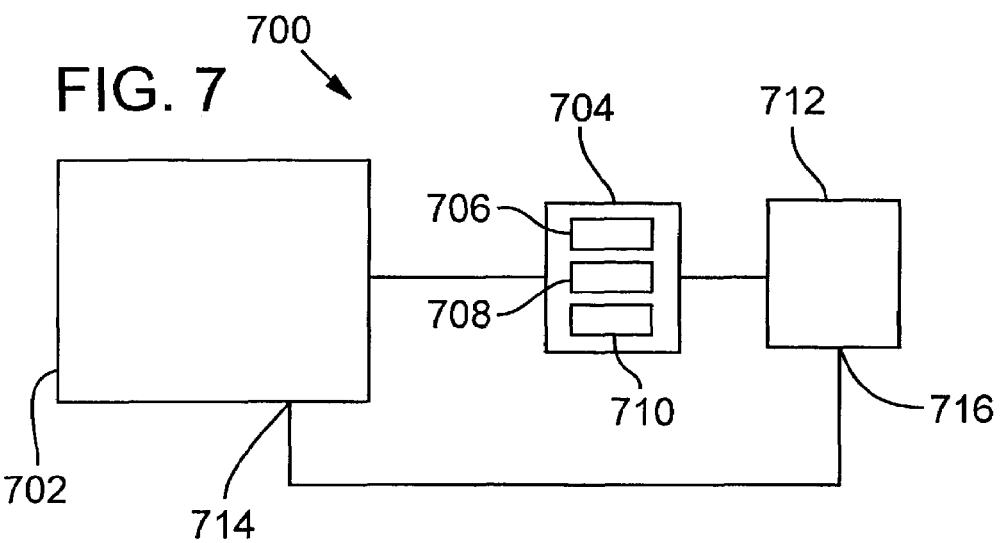
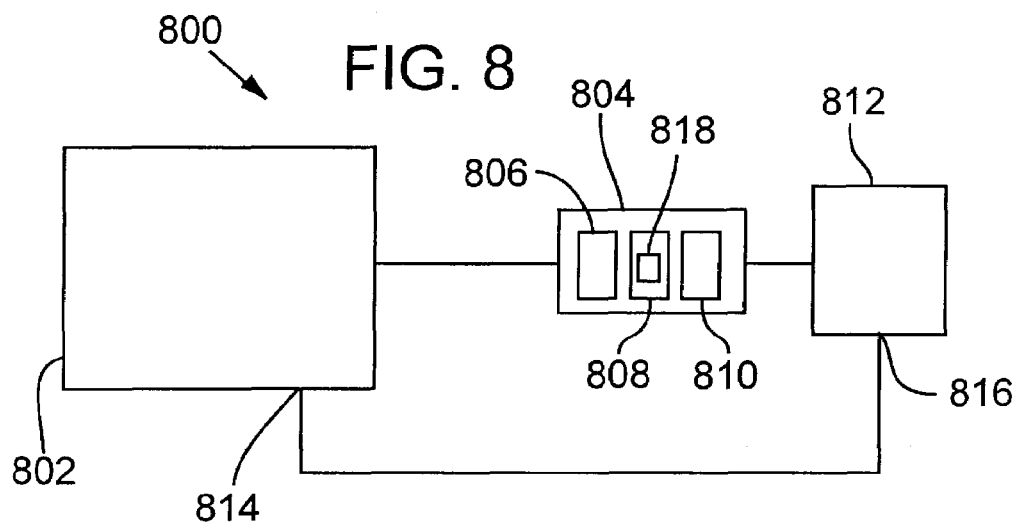
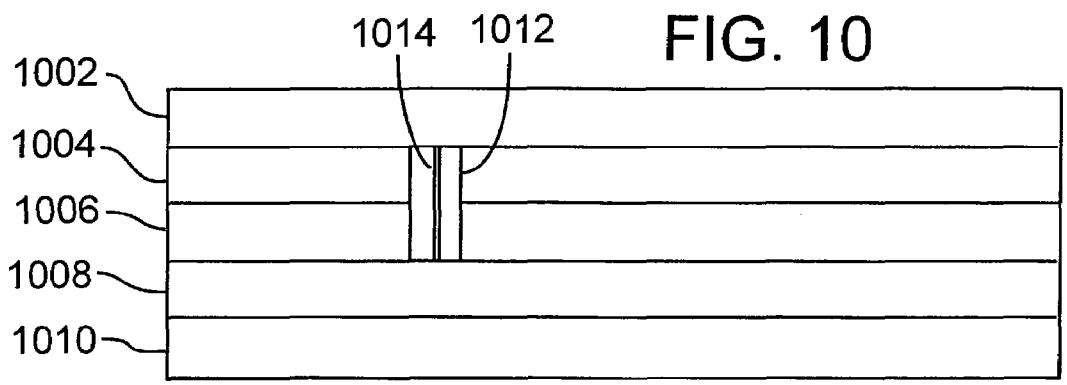

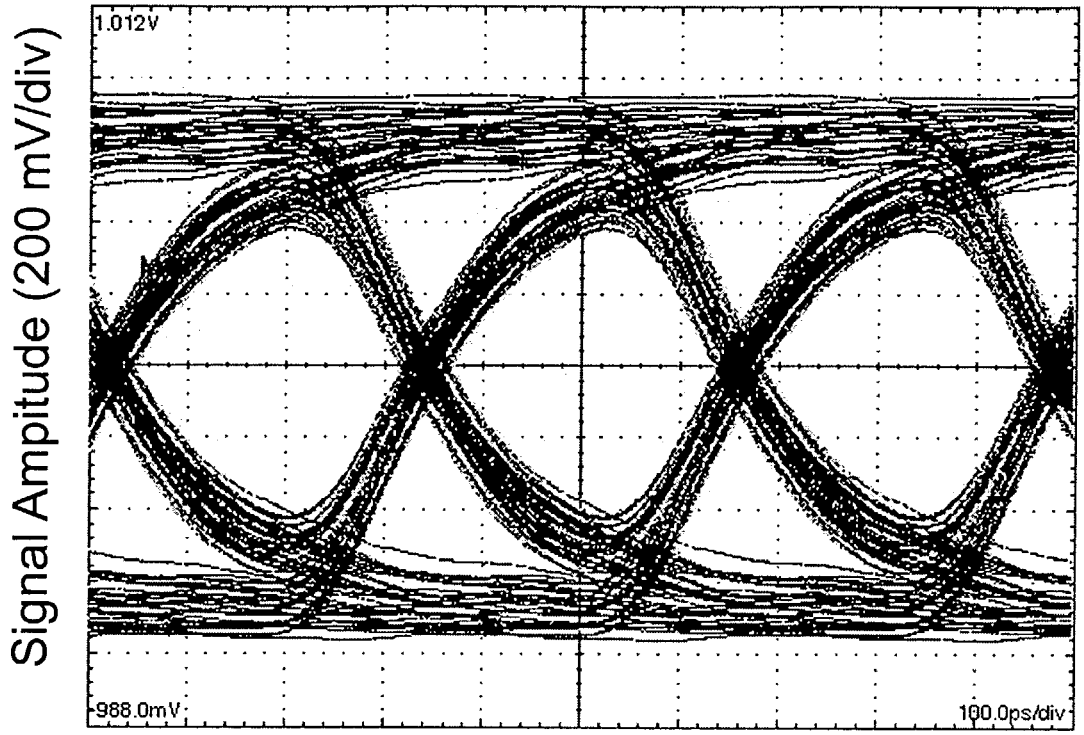
FIG. 13A  Time (100 ps/div)
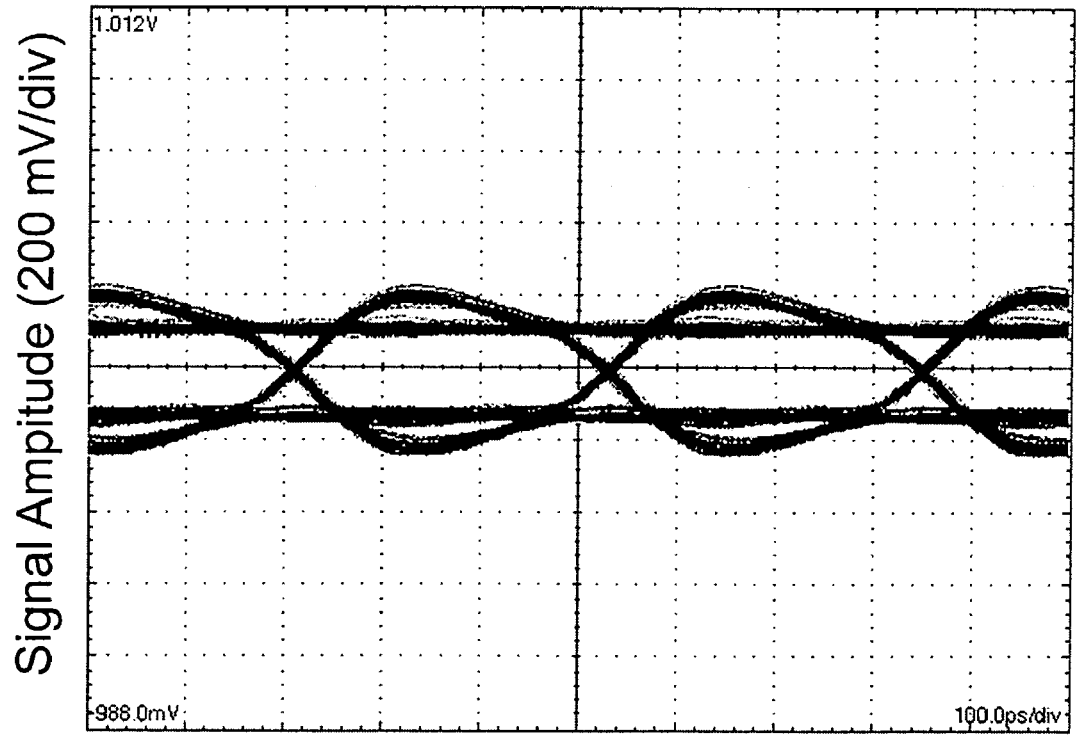
FIG. 13B  Time (100 ps/div)

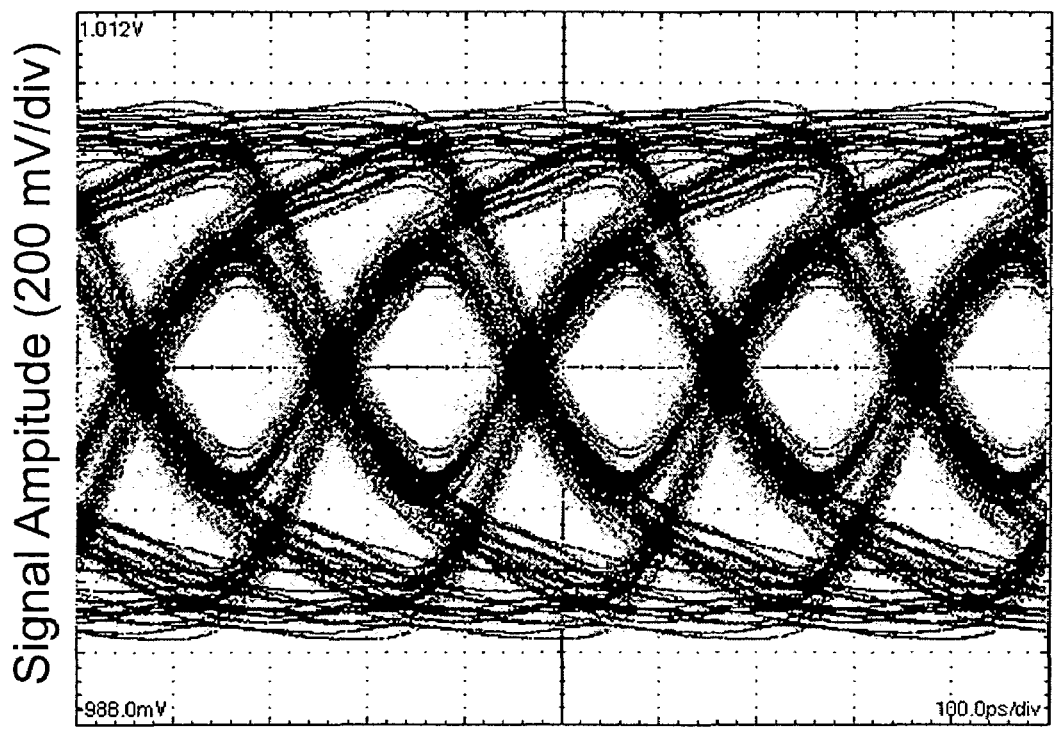
FIG. 14A    Time (100 ps/div)
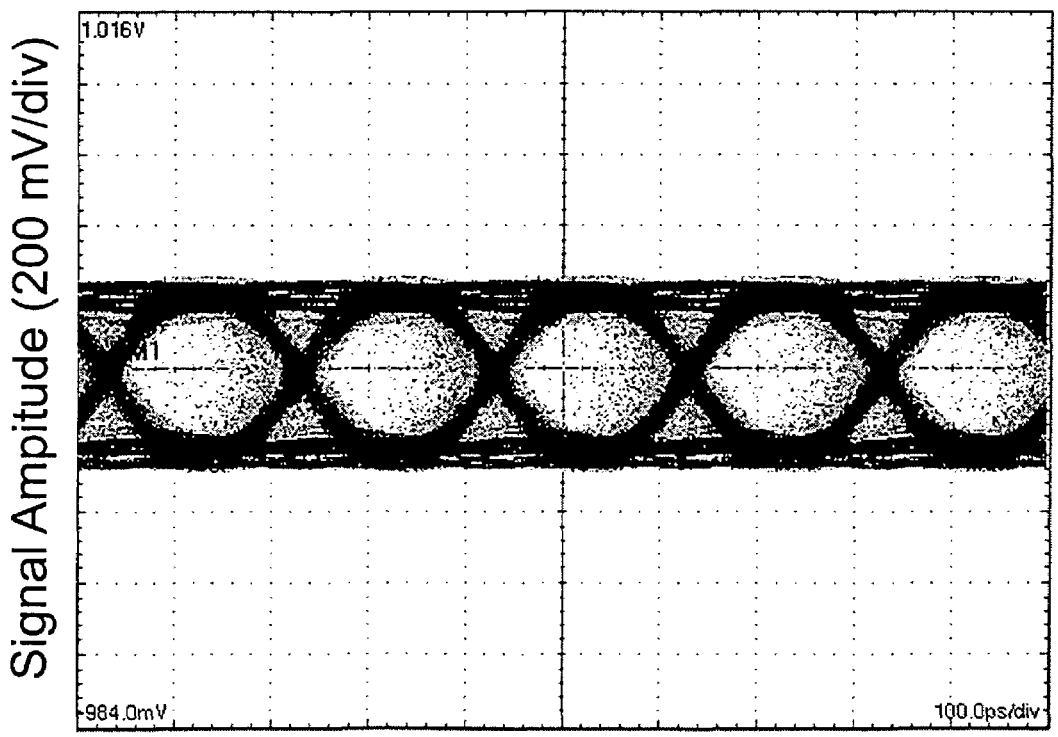
FIG. 14B    Time (100 ps/div)

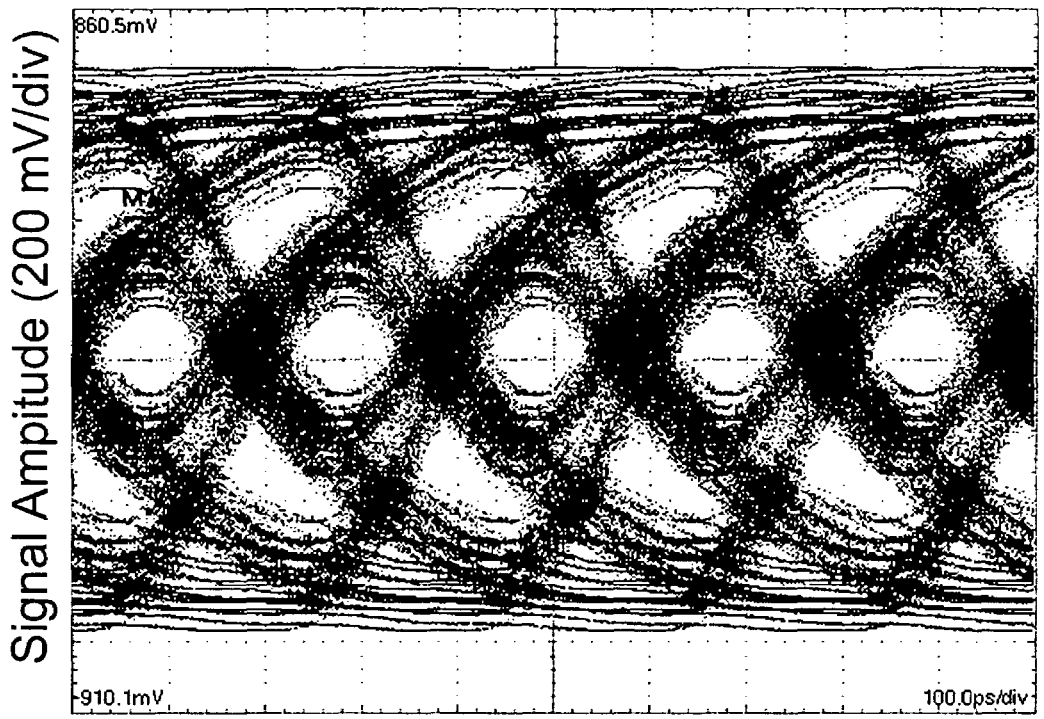
FIG. 15A    Time (100 ps/div)
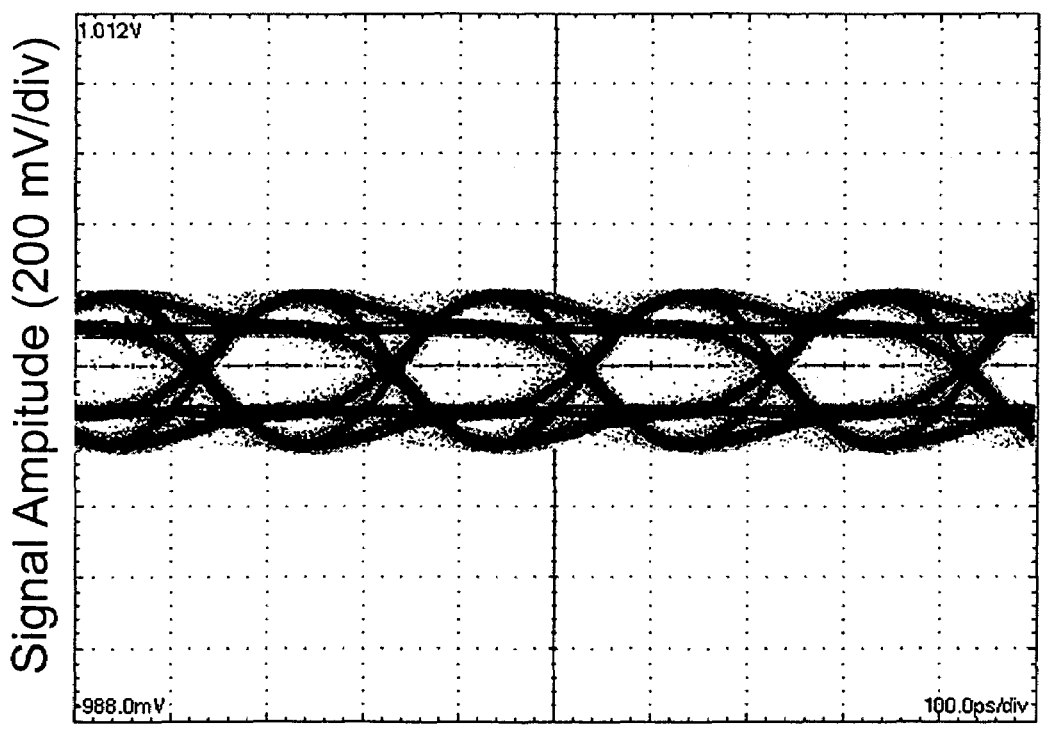
FIG. 15B    Time (100 ps/div)

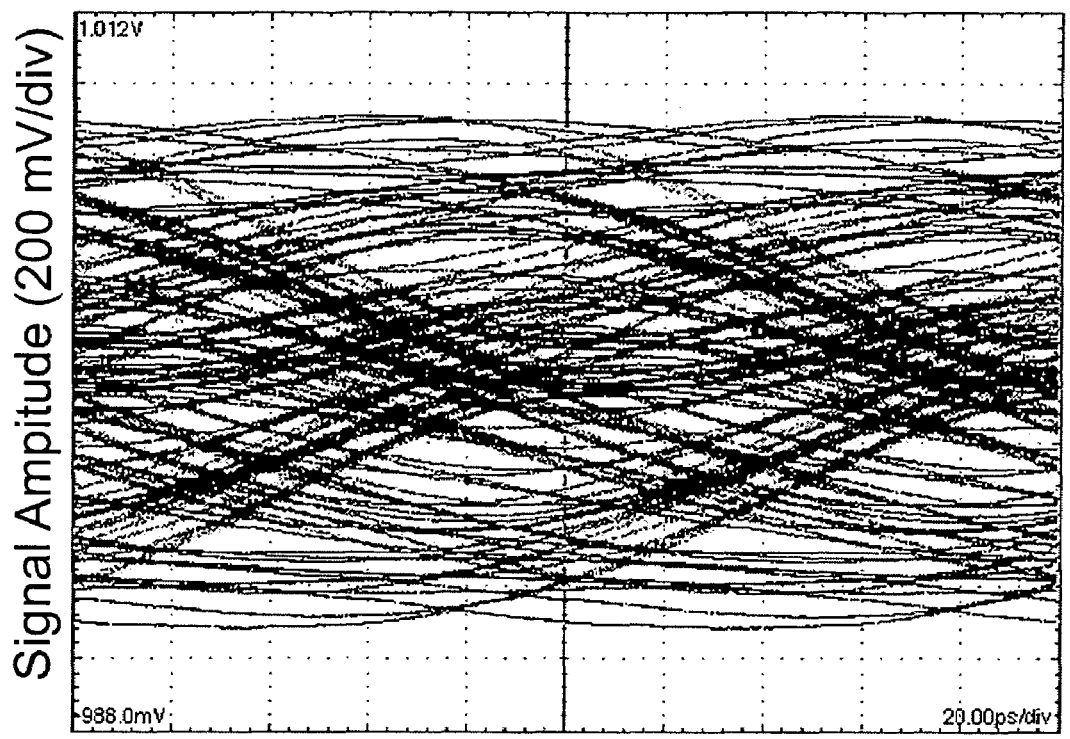
FIG. 16A    Time (20 ps/div)
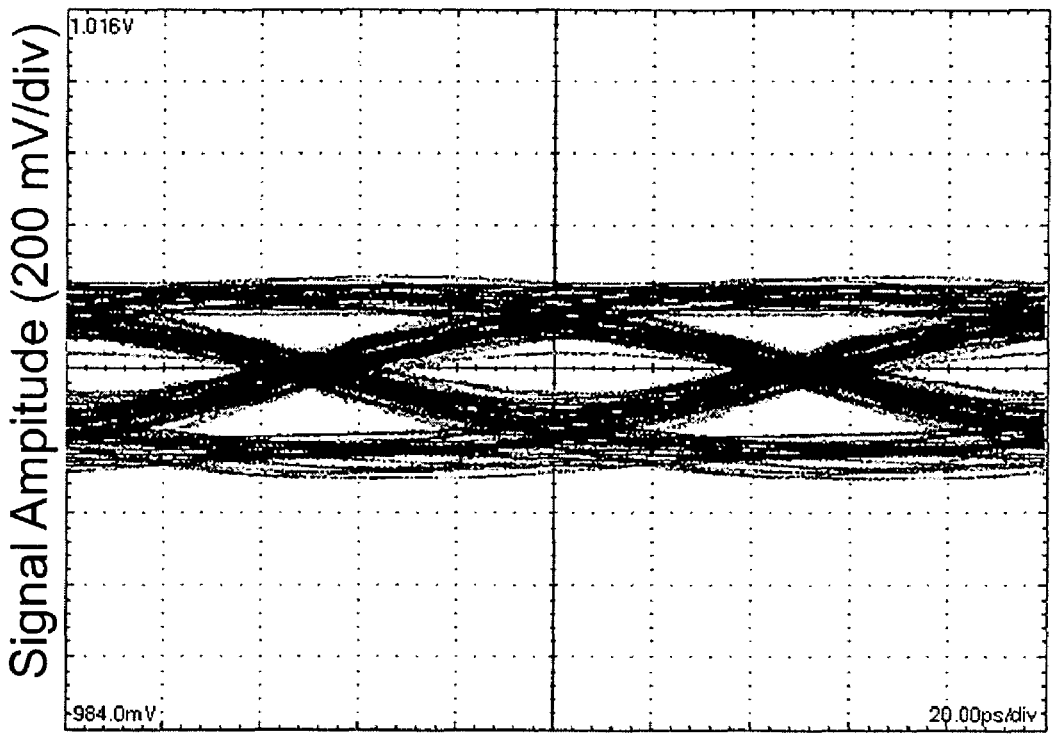
FIG. 16B    Time (20 ps/div)

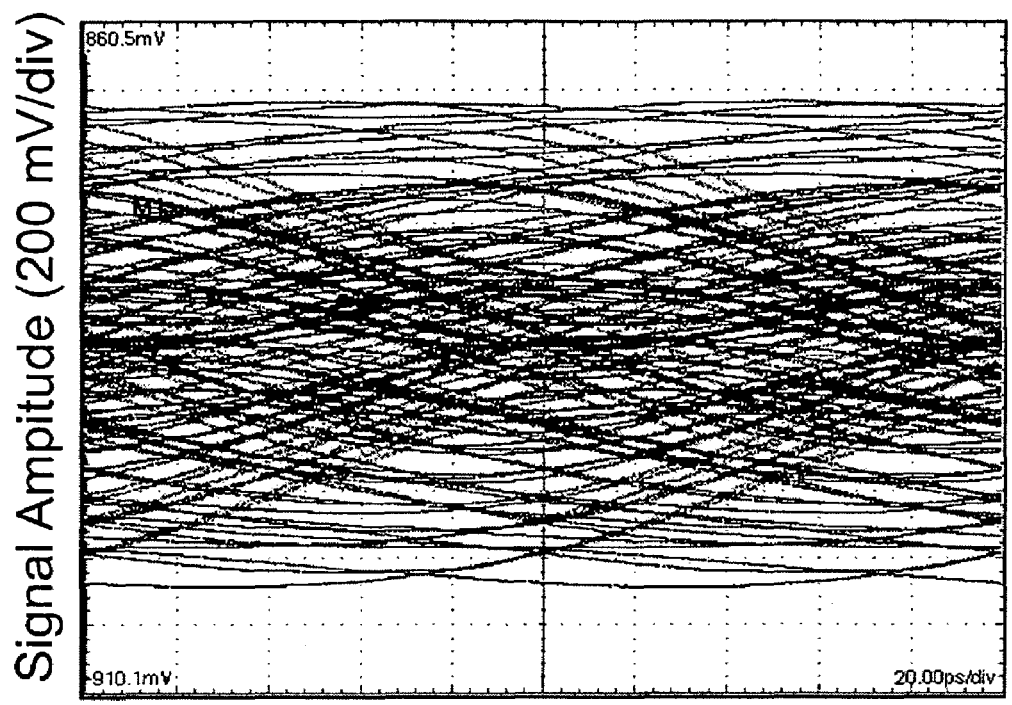
FIG. 17A   Time (20 ps/div)
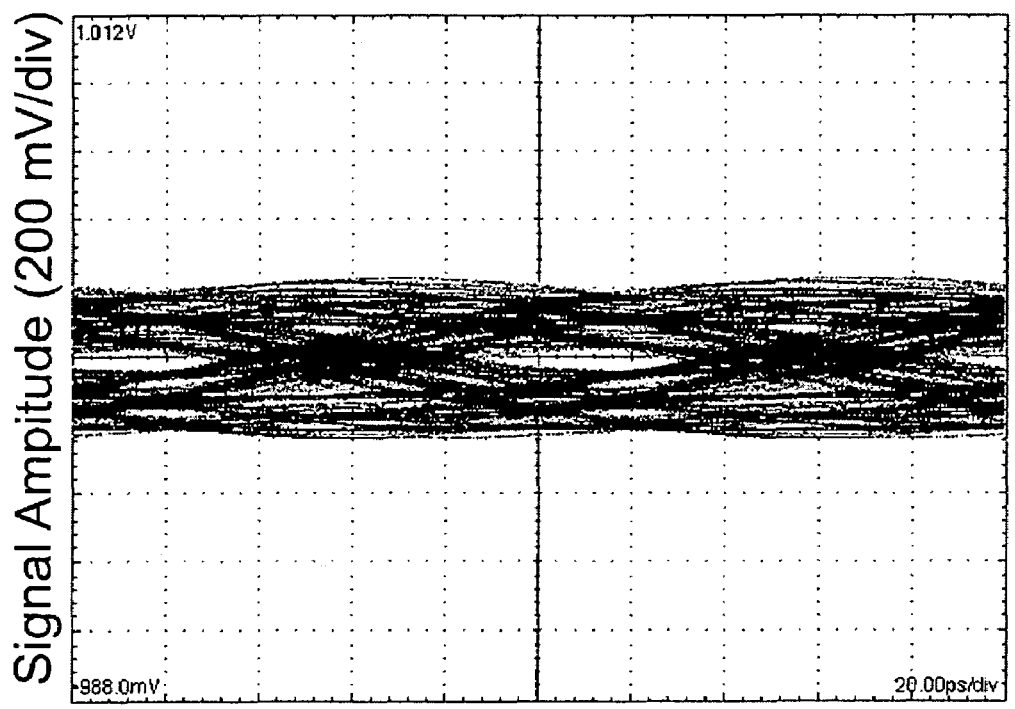
FIG. 17B   Time (20 ps/div)

DIELECTRIC LOSS COMPENSATION METHODS AND APPARATUS

CROSS-REFERENCE TO RELATED APPLICATIONS

This application claims the benefit of U.S. Provisional Application No. 60/352,618, filed Jan. 28, 2002.

TECHNICAL FIELD

The invention pertains to methods and apparatus for communication of high frequency electrical signals.

BACKGROUND

High data rate communication systems have been developed for long distance telecommunications, distribution of video and other data, and for computer networking applications. Transmission and reception of high bit-rate data signals is complicated by the difficulties in transmitting, detecting, and processing signals at high data rates. For example, at the SONET OC-192 data rate (about 10 Gb/s), electrical systems must generally be configured as waveguides and ample consideration given to stray inductances and capacitances. In addition, regeneration of such signals is difficult, and amplifiers having adequate gain bandwidths tend to be expensive.

At low frequencies, the electrical properties of materials used in circuit fabrication such as semiconductor substrates, circuit board substrates, and other materials tend to be suitable for communication of electrical signals between circuit board mounted components without significant distortion or signal loss. Unfortunately, at higher data rates, the electrical properties of conductors and dielectrics used for circuit fabrication are not ideal, and introduce data signal defects that can be associated with unacceptable increases in bit error rates. Accordingly, methods and apparatus are needed that provide improved signal integrity, particularly for data signals at bit rates of 1 Gb/s and higher.

SUMMARY

Methods of compensating for dielectric losses in propagation of digital signals having a bit rate greater than or equal to 3.125 gigabits per second and traveling along a signal transmission path in a plural layered printed circuit board are provided. First and second sections of a signal transmission path that has an input and an output are provided, wherein the signal transmission path is positioned in at least one layer of the printed circuit board. A capacitor is positioned in series with the first and second sections of the transmission path and in at least one layer of the printed circuit board to couple the first section of the transmission path to the second section of the transmission path. According to representative embodiments, the methods include the act of providing a resistive shunt that electrically connects the first section to the second section to provide a capacitor bypass path for low frequency components of the digital signals. According to additional embodiments, the methods include the act of providing at least two vias positioned to electrically couple the resistive shunt to the first and second sections. According to further illustrative embodiments, the printed circuit board comprises a backplane and the resistive shunt is supported by the backplane of the printed circuit board. In other examples, the printed circuit board comprises at least one electrical component supporting surface and a resistive shunt is mounted to the electrical component supporting surface.

In representative examples, the methods include positioning a capacitor having first and second plates in a common layer of the printed circuit board. In some examples, the capacitor includes side-by-side capacitor plates in the common layer or interleaved capacitor plates in the common layer. In other examples, the first and second plates include a plurality of interdigitated conductor portions. In other representative examples, the capacitor includes first and second at least partially overlapping capacitor plates in spaced apart layers of the printed circuit board or first and second overlapping portions of respective first and second transmission path sections.

Methods of compensating for dielectric losses in signals traveling along a signal transmission path having an input and an output and positioned in at least one layer of a plural layered printed circuit board are provided. The methods include providing at least one inductor and electrically connecting the at least one inductor from the transmission path to an electrical ground potential. According to representative embodiments, the at least one inductor is formed at least partially within at least one layer of the printed circuit board. In additional examples, a series resistance is provided.

Methods of modifying a digital signal passing along a signal trace from an input to an output of the trace to compensate for dielectric signal losses include evaluating the dielectric losses expected to be incurred in a digital signal which traverses the signal trace from the input to the output. The signal is passively distorted at at least one location along the trace in accordance with the evaluated dielectric losses to produce a digital signal at the output of the trace which is an amplitude-reduced substantial replica of the digital signal at the input of the trace. According to representative embodiments, the expected dielectric losses along the signal trace are estimated or measured. According to additional representative embodiments, the evaluated dielectric losses are obtained by applying differing magnitudes of passive distortion to a digital signal traveling along the signal trace and comparing the digital signal at the output of the signal trace to the digital signal at the input of the signal trace. A magnitude of passive distortion is determined that results in a digital signal at the output of the trace that is a substantial replica of the digital signal at the input of the trace. In representative embodiments, the signal is passively distorted by capactively coupling a first section of the trace to a second section of the trace at the at least one location. According to illustrative embodiments, at least one capacitor of capacitance from about 0.5 pF to about 1.5 pF is inserted in series with the first and second sections of the signal trace.

In other examples, the signal is passively distorted by connecting at least one inductor from the trace to an electrical ground plane. In additional examples, series or shunt resistances are provided.

Methods of modifying a signal passing along a signal trace from an input to an output of the trace to compensate for dielectric losses in the signal as it travels from the input to the output include evaluating the dielectric losses expected to be incurred in a signal which traverses the signal trace from the input to the output. Based on the evaluated dielectric loss, the signal is passively distorted at at least at one location along the trace to produce a signal at the output of the trace which is an amplitude-reduced, substantial replica of the signal at the input of the trace. In representative examples, the at least one inductor has a value of inductance from about 1 nH to about 2 nH. According to illustrative examples, the at least one location is closer to the input to the signal trace than to the output of the signal trace, or adjacent to the input of the signal trace.

Multilayered electronic circuits defining at least one signal transmission path having an input and an output include a signal source means for delivering a high frequency digital signal to the input and a signal receiver means for receiving the digital signal from the output. A means for introducing distortion into the digital signal is situated to distort the signal as it travels from the input to the output to compensate for dielectric losses. According to representative embodiments, the means for introducing distortion is included in at least one layer of a plural layered printed circuit board. According to representative examples, the means for introducing distortion is a capacitive means or an inductive means.

Apparatus for compensating for dielectric losses in digital signals include a plural layered electronic circuit comprising at least one digital signal transmission path having an input at which digital signals are received and an output from which digital signals which have traveled along the digital signal path are delivered. A dielectric loss compensator is coupled to the digital signal transmission path and incorporated at least partially in a layer of the electronic circuit, wherein the dielectric loss compensator is configured to alter a digital signal travelling along the transmission path to provide a digital signal at the output that is a substantial replica of the digital signal at the input.

In illustrative embodiments, the transmission path includes first and second transmission path sections positioned in at least one layer of the electronic circuit and the dielectric loss compensator includes at least one capacitor in series with the first and second transmission path sections so as to capacitively couple the first section of the transmission path to the second section of the transmission path. According to other examples, a resistive shunt electrically connects the first transmission path section to the second transmission path section such that low frequency components of digital signals passing along the transmission path bypass the at least one capacitor. In representative examples, the electronic circuit includes at least two vias electrically connecting the resistive shunt to the first and second transmission path sections.

According to representative examples, the capacitor includes first and second capacitor plates in a common layer of the electronic circuit, side-by-side capacitor plates in the common layer, or interleaved capacitor plates in the common layer. In other representative embodiments, the capacitor includes first and second at least partially overlapping capacitor plates on spaced apart layers of the electronic circuit or first and second overlapping portions of the respective first and second transmission path sections.

According to further illustrative embodiments, the dielectric loss compensator includes at least one inductor electrically connecting the transmission path to an electrical ground plane. The at least one inductor is formed at least partially within at least one of the layers of the electronic circuit. In some examples, the digital signal is at a bit rate greater than 3.125, 5, or 10 Gb/s. In other examples, the dielectric loss compensator includes a resistance in series with the at least one inductor.

The invention is directed to methods and apparatus having novel and nonobvious features and combinations of features. Representative inventive features and combinations of features are described below with reference to the accompanying drawings.

BRIEF DESCRIPTION OF THE DRAWINGS

FIG. 7 is a schematic block diagram of a measurement system configured to determine dielectric loss using an array of compensators.

FIG. 8 is a schematic block diagram of a communication system module configured for measurement of eye diagrams.

FIG. 10 is a sectional view of an equalizer that includes an inductor.

FIGS. 13A–13B are eye diagrams associated with a 3.125 Gb/s data signal propagating on a 30 inch long trace defined on an FR4 dielectric. FIGS. 13A–13B illustrate the eye opening without and with dielectric loss compensation, respectively.

FIGS. 14A–14B are eye diagrams associated with a 5 Gb/s data signal propagating on a 21 inch long trace defined on an FR4 dielectric. FIGS. 14A–14B illustrate the eye opening without and with dielectric loss compensation, respectively.

FIGS. 15A–15B are eye diagrams associated with a 5 Gb/s data signal propagating on a 30 inch long trace defined on an FR4 dielectric. FIGS. 15A–15B illustrate the eye opening without and with dielectric loss compensation, respectively.

FIGS. 16A–16B are eye diagrams associated with a 10 Gb/s data signal propagating on a 21 inch long trace defined on an FR4 dielectric. FIGS. 16A–16B illustrate the eye opening without and with dielectric loss compensation, respectively.

FIGS. 17A–17B are eye diagrams associated with a 10 Gb/s data signal propagating on a 30 inch long trace defined on an FR4 dielectric. FIGS. 17A–17B illustrate the eye opening without and with dielectric loss compensation, respectively.

DETAILED DESCRIPTION

Figure 1A:
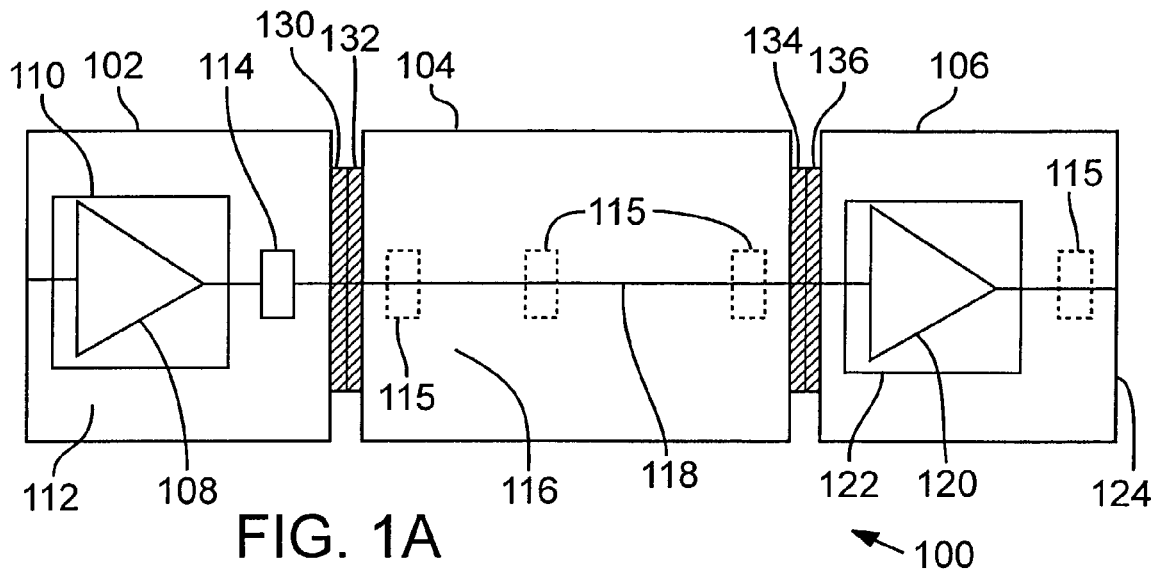
FIGS. 1A–1B are schematic block diagrams of backplane interconnect systems that include a transmitter, receiver, and a backplane interconnect.

High speed communication systems that operate at bit rates of 1 Gb/s and higher encounter several limitations that are more readily avoided in lower speed systems. For example, high bit rate signals can be attenuated and distorted during propagation due to the losses associated with the dielectrics used to define communication circuitry and the skin effect in circuit conductors. Some signal distortions and losses are frequency dependent so that various frequency components of a data signal experience differing losses. As a result, different bit patterns in a transmitted data signal can experience different signal distortions, complicating extraction of the correct transmitted bit pattern at a receiver.

Representative sources of frequency dependent loss and signal distortion include dielectric loss and skin effect losses. Skin effect losses associated with signal propagation on conductors are generally proportional to a square root of frequency. Data signals propagating on conductors situated near a dielectric material experience a frequency dependent loss that is approximately proportional to a product of a material dependent quantity $G_d$ and frequency. At sufficiently high frequencies, dielectric losses are generally larger than skin effect losses. These losses and distortions become increasingly more significant in electrical signals at the very high bit rates associated with high speed Fibre Channel or SONET OC-192 and OC-768 data rates. Such losses and distortions can be associated with attenuation and/or jitter or other amplitude or time distortions in transmitted data signals. As used herein, high bit rates are data rates of about 1 Gb/s and higher, very high bit rates are data rates greater than about 3.125 Gb/s, and ultrahigh bit rates are data rates greater than about 10 Gb/s and higher. Better results have been observed as bit rates increase from high bit rates, but lower bit rates can be used. In some examples, better results are observed at frequencies or bit rates at which frequency-dependent losses associated with one or more dielectric layers significantly degrade signal quality.

Frequency dependent losses such as dielectric losses can be compensated, equalized, or at least partially corrected by providing a network having a suitably configured frequency response. Such a network can be situated to predistort a data signal prior to transmission, or to apply compensation in association with data reception. Some suitable electrical networks include a series capacitor, a series capacitor and resistor, a parallel inductor, and a parallel inductor and a series resistor. The values of capacitance, inductance, and resistance can be selected based on a total dielectric loss or other frequency-dependent loss or distortion. Such networks can be defined on circuit substrates such as in/on layers of single layer or multilayer circuit boards, or on semiconductor substrates that can also define active circuit components. For typical multilayer circuit boards, suitable circuit components for these compensation networks such as capacitors and inductors can be defined in circuit board areas of about a few square millimeters or less.

A data signal having a bit rate $f_{BIT}$ includes significant frequency components at frequencies up to about 1.5 to 2 times the bit rate. The magnitude of lower frequency components of the data signal depends on data encoding and a maximum number of sequential bits transmitted without a transition. Some associated signals such as clock signals can involve a series of transitions at the data bit rate and lower frequency components of such signals tend to be of lesser importance. Accordingly, in some cases, signal correction or compensation networks are configured for compensation of frequency dependent losses that are more important for high frequency components, as well as transmission of low frequency components. For signals such as clock signals, low frequency components tend to be less important, and compensation networks typically do not need to correct or distort low frequency components. In some cases, transmission of low frequency components is unnecessary.

With reference to FIG. 1A, a communication system 100 includes a transmitter 102, a receiver 106, and an interconnect 104. The transmitter 102 includes an amplifier chip 108 that is contained in a chip package 110 that is mounted to a transmitter circuit board 112. The transmitter circuit board 112 can be made of epoxy or other materials and can include one, two, or more conductive layers and/or dielectric layers configured to, for example, supply power, control signals, and transmit/deliver data signals. Generally the transmitter board 112 is a multilayer board having three or more layers. The transmitter board 112 includes an equalizer 114 that can be defined in one or more of the layers, in vias between layers, or otherwise defined. As used herein, a via is a designed opening in an insulating material between conductor layers used to provide interlayer connection by means of a conductive filling, or an interlayer electrical connection that passes through such a designed opening.

In some representative examples, an equalizer 115 can be provided at other locations as shown in FIG. 1A, or additional equalizers can be provided. Generally, a compensator or equalizer is preferably situated near an output or input of an amplifier to reduce time delays associated with circulation of reflected signal components. In some examples, compensators or equalizers are provided at two or more locations, and each of the equalizers can be configured to provide partial compensation.

The interconnect 104 is defined on a circuit board 116 and typically includes one or more layers that are configured to, for example, receive and distribute data signals, control signals, or supply power to transmitters, receivers, or other systems connected to the interconnect 104. FIG. 1A shows a representative data signal distribution path 118. The receiver 106 includes an amplifier chip 120 contained in a package 122 that is mounted to a receiver circuit board 124. The receiver circuit board 124 can be a multilayer board and can be made of various materials, such as, for example, FR4 epoxy. The transmitter 102, the interconnect 104, and the receiver 106 include connectors 130, 132, 134, 136 and the interconnect 104 can include additional connectors configured to receive additional transmitters, receivers, or other devices.

Figure 1B:
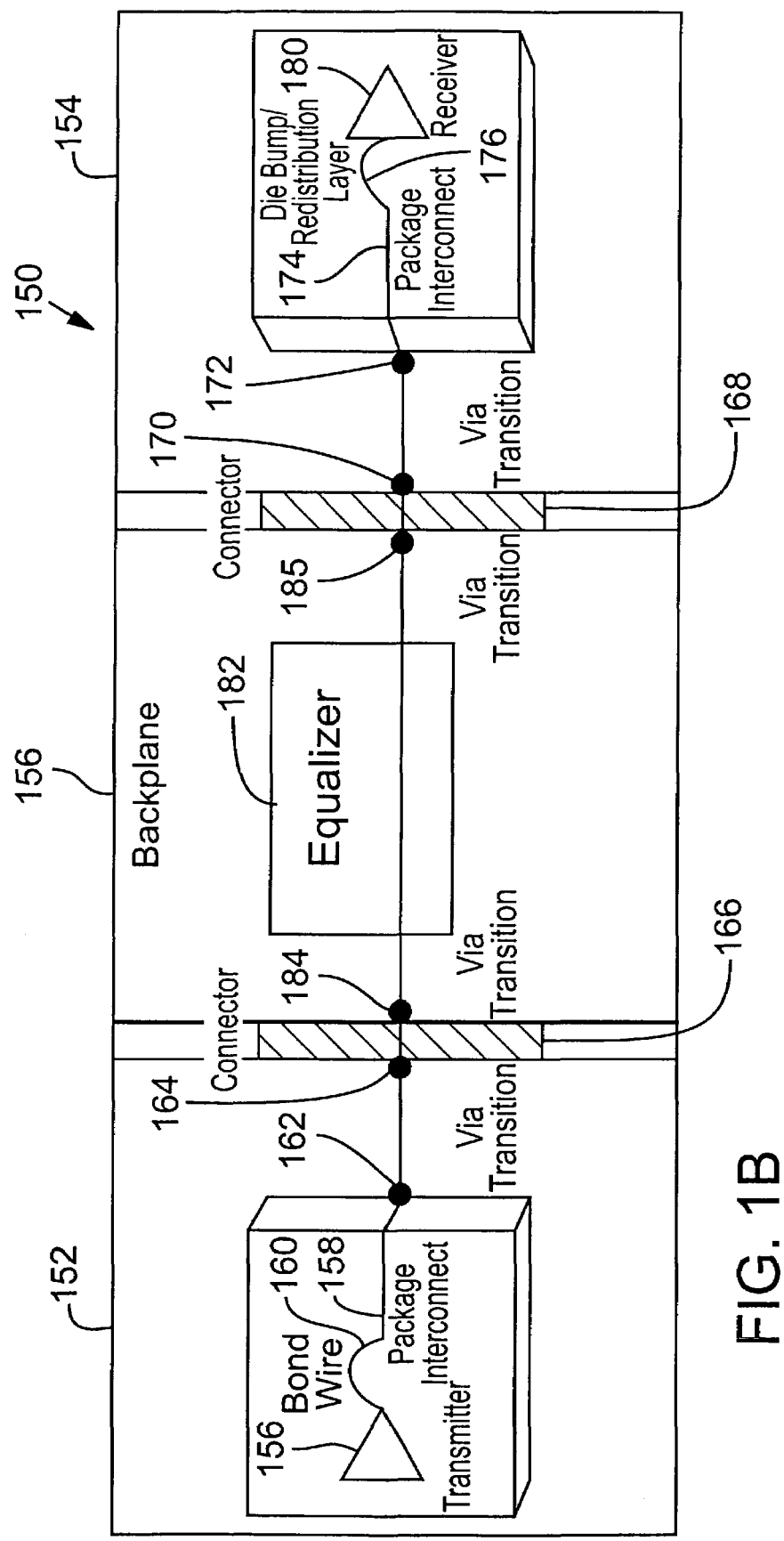

With reference to FIG. 1B, a backplane interconnect system 150 includes input/output cards (I/O cards) 152, 154 and a backplane 156. The I/O card 152 includes a transmitter 156 that is electrically connected to a package interconnect 158 with a bond wire 160. The transmitter 156 is in communication with one or more layers of the I/O card 152 through vias 162, 164. Connector assemblies 166, 168 are situated to electrically connect the I/O cards 152, 154 to the backplane 156. The I/O card 154 includes vias 170, 172 configured to deliver a data signal to a package interconnect 174. A transmitter 180 is electrically connected to the package interconnect 174 with a bond wire 176. The backplane 156 include vias 184, 185 configured to electrically connect an equalizer 182 to the I/O cards 152, 154.

Figure 1C:
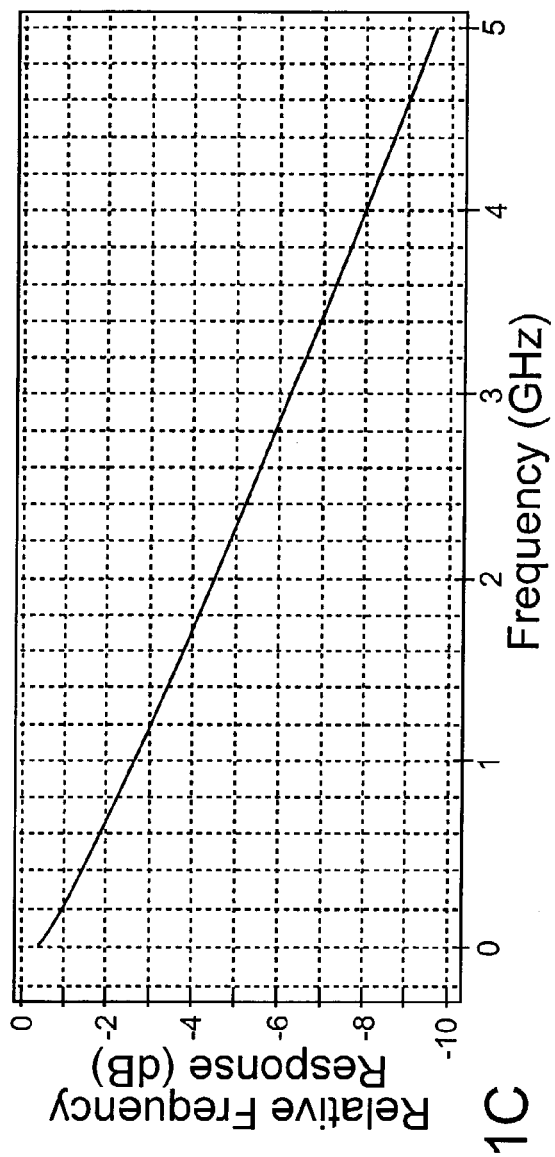
FIGS. 1C–1D are graphs of frequency responses of a 20 inch long conductive trace and a 40 inch long conductive, respectively, on an epoxy substrate.
Figure 1D:
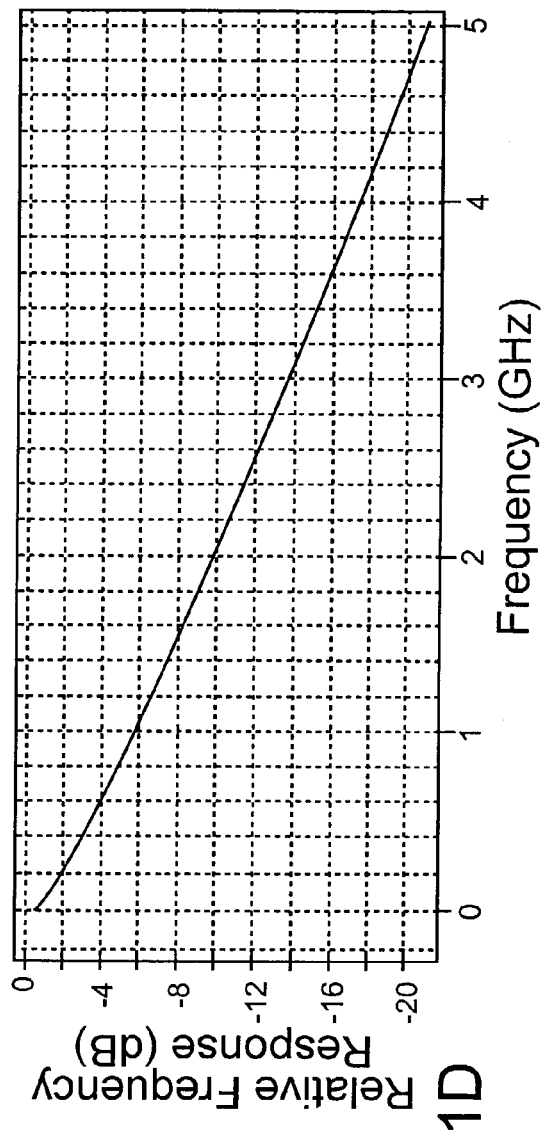
Figure 1E:
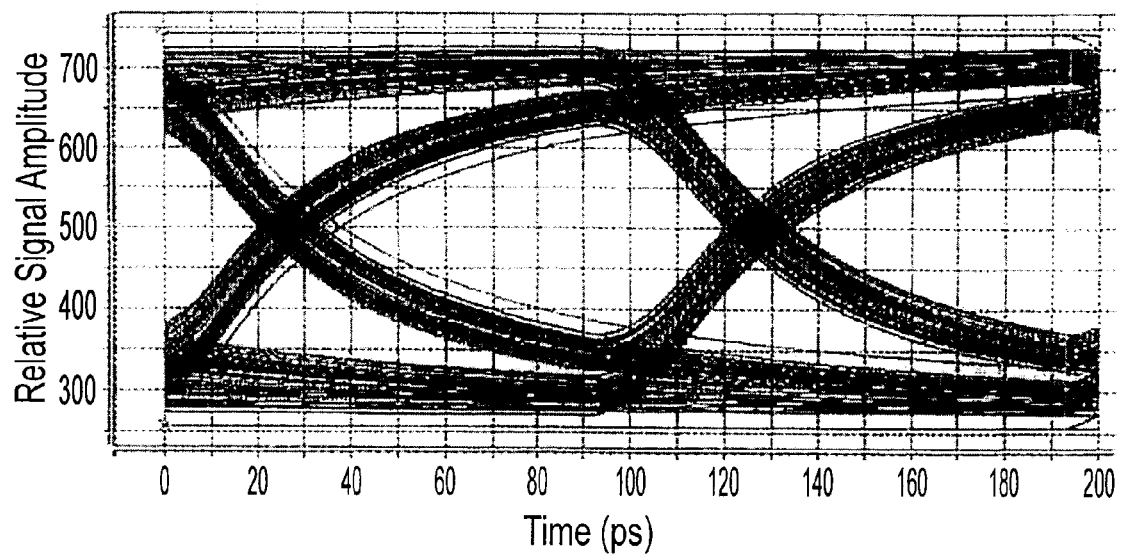
FIGS. 1E–1F illustrate received eye patterns associated with signal propagation on 20 inch long and 40 inch long conductive traces, respectively, defined on an epoxy substrate.
Figure 1F:
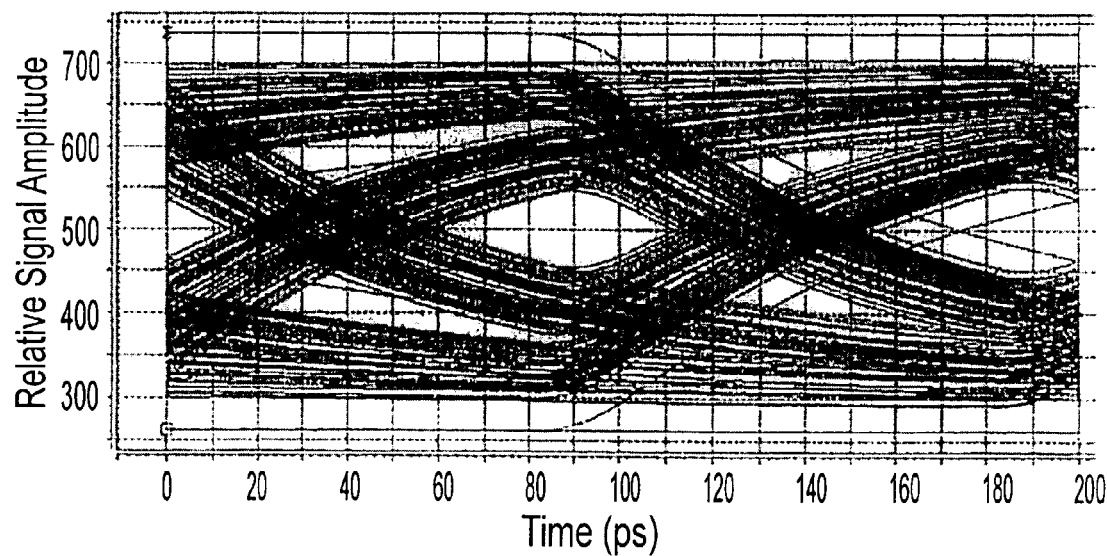

Example frequency responses of conductive traces on an FR4 epoxy substrate are illustrated in FIGS. 1C–1D. FIG. 1C shows frequency response for a 20 inch long conductive trace. FIG. 1D shows frequency response for a 40 inch long conductive trace. The frequency responses of FIGS. 1C–1D are largely dependent on dielectric losses. Received eye patterns associated with signed propagation on 20 inch long and 40 inch long conductive traces, respectively, on FR4 epoxy are shown in FIGS. 1E–1F.

Figure 1G:
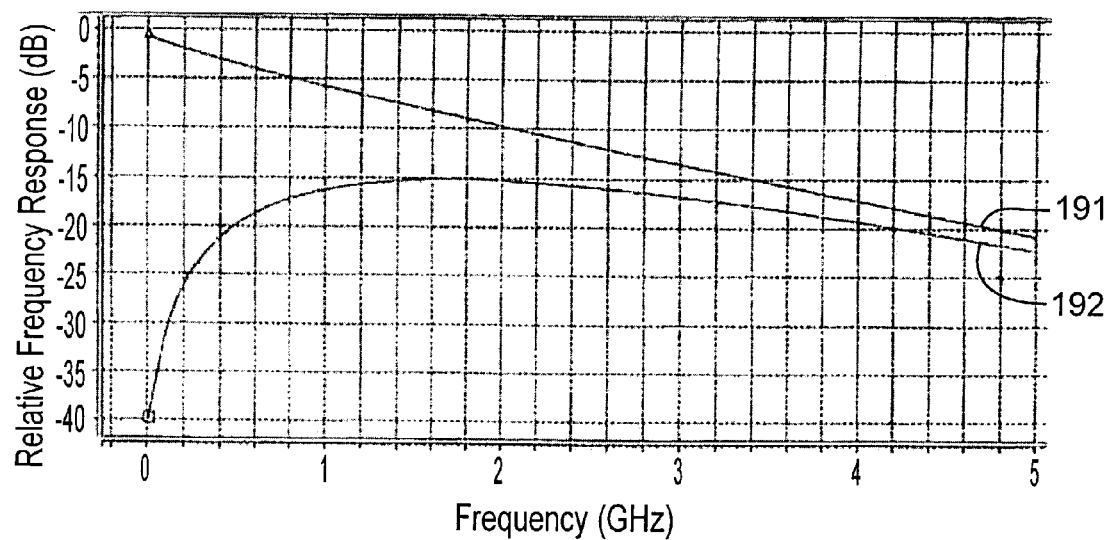
FIG. 1G is a graph of uncompensated and compensated frequency responses associated with a 40 inch long trace on an epoxy substrate.
Figure 1H:
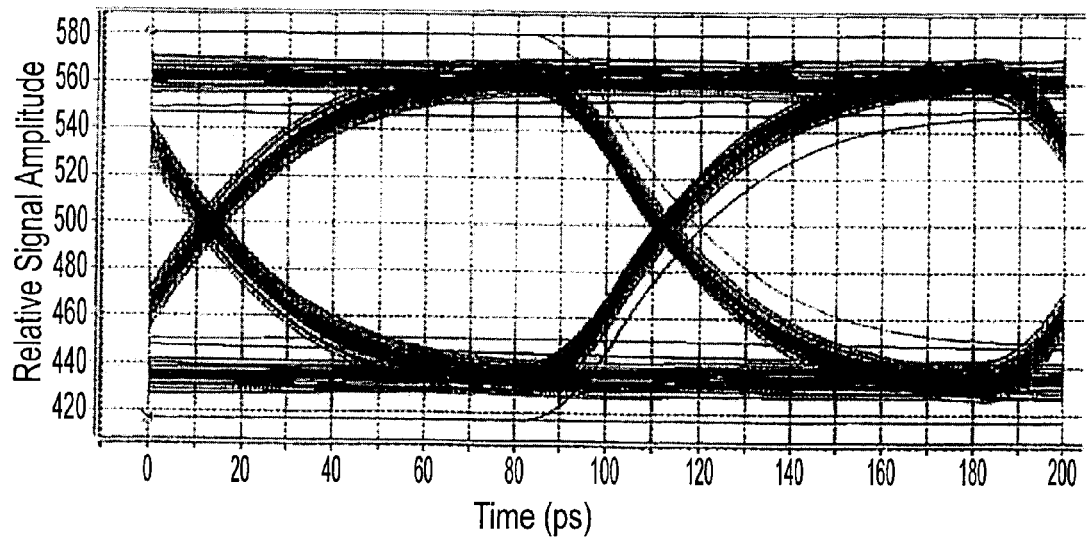
FIG. 1H illustrates a received eye diagram associated with the compensated frequency response of FIG. 1G.

Because frequency-dependent dielectric losses are proportional to a product ($G_d f$) of the material dependent quantity $G_d$ and frequency f, such losses and associated distortions can be at least partially compensated with an equalizer or compensator having a frequency-dependent impedance of $1/G_d f$. Such a compensator can be implemented as, for example, a capacitor of capacitance C, wherein $G_d$ is replaced with $2\pi C$. An eye diagram associated with capacitive/resistance-compensation of a 40 inch conductive trace on FR4 epoxy is illustrated in FIG. 1H. Uncompensated and compensated frequency response curves 191, 192, respectively, are shown in FIG. 1G.

Figure 1I:
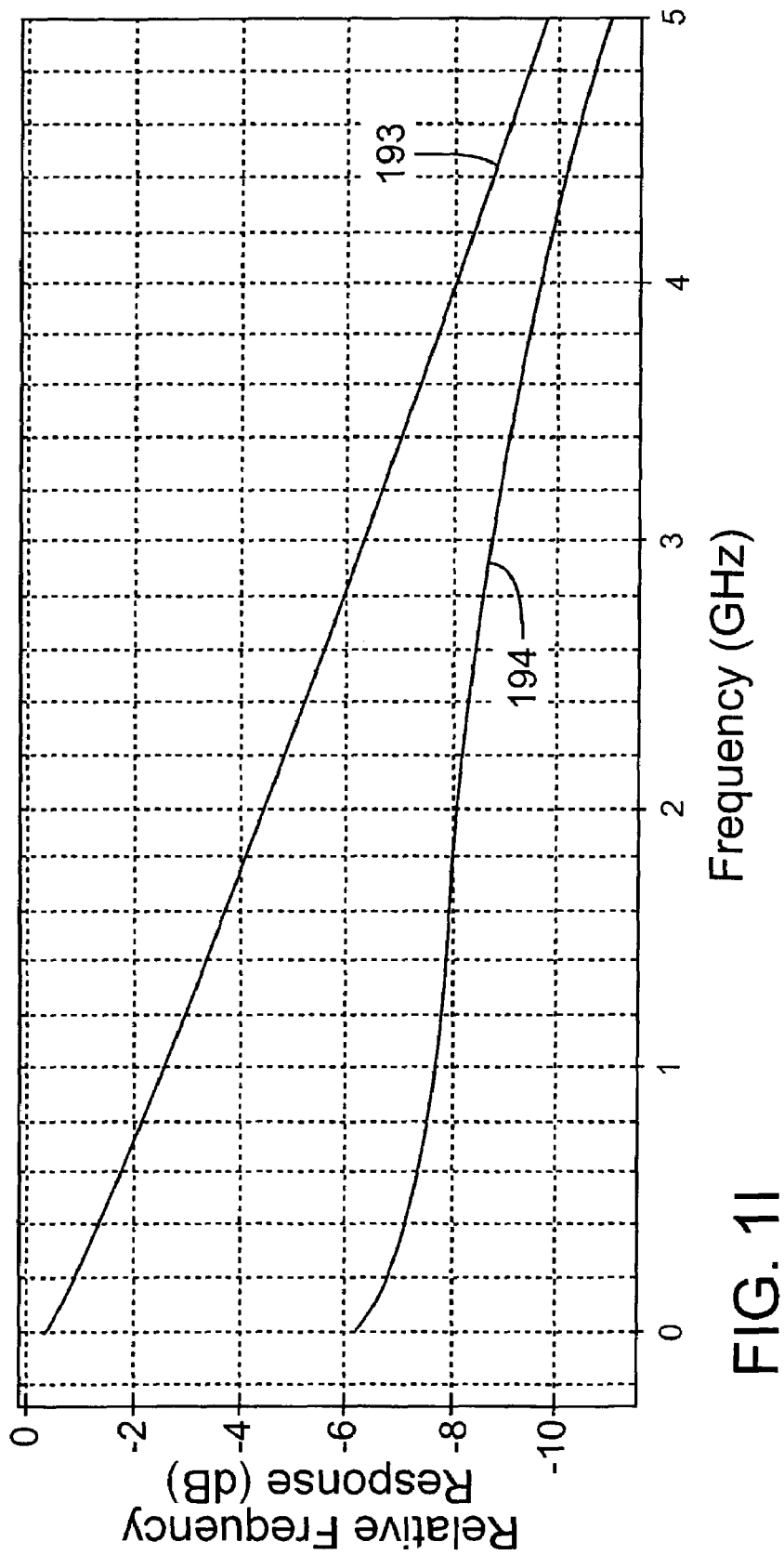
FIG. 1I is a graph of uncompensated and capacitor/resistor compensated frequency responses of a 20 inch long conductive trace on an epoxy substrate.
Figure 1J:
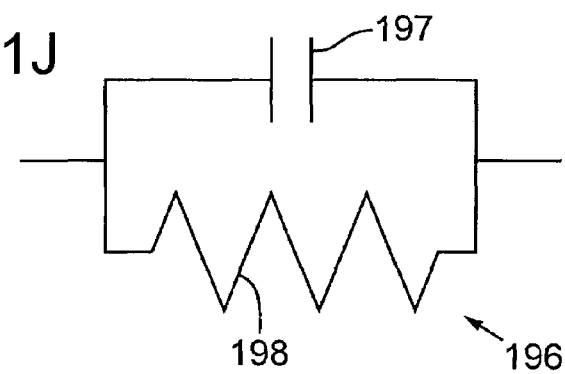
FIG. 1J is a schematic diagram of a resistance/capacitance compensation network.
Figure 1K:
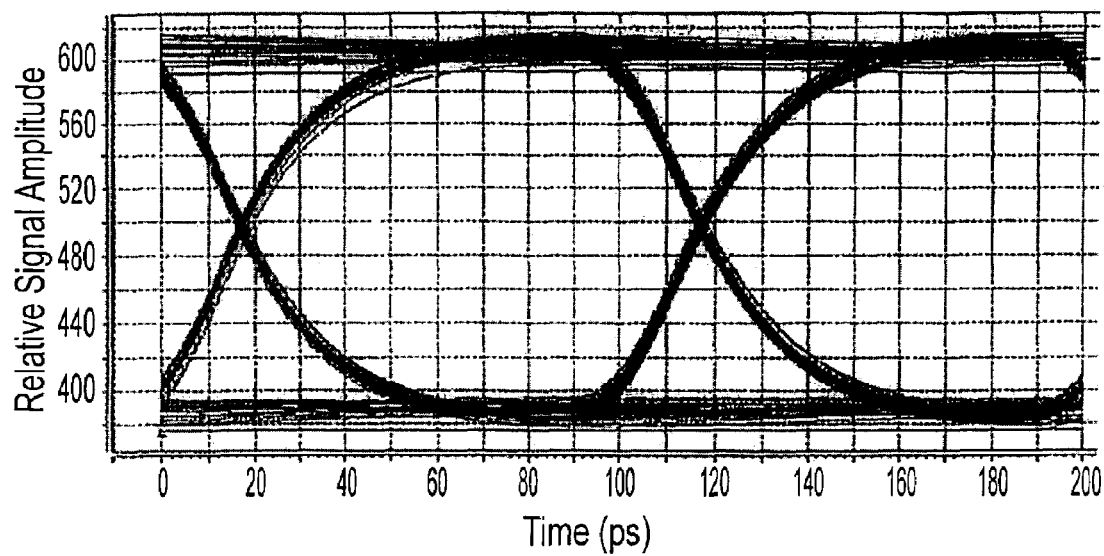
FIG. 1K illustrates an eye diagram associated with resistance/capacitance compensation of frequency response of a 20 inch long conductive trace on an epoxy substrate.

Compensation of a 20 inch long conductive trace on FR4 epoxy using capacitance and resistance is illustrated in an eye diagram shown in FIG. 1K, and the associated compensated and uncompensated frequency response curves 193, 194 are shown in FIG. 1I. A representative capacitance-based compensator 196 includes a resistor 198 and a capacitor 197 and is illustrated in FIG. 1J. Capacitance values associated with such compensators or equalizers can be on the order of 0.5 pf to 1 pF that can be provided using conductors in or on circuit boards.

Figure 2:
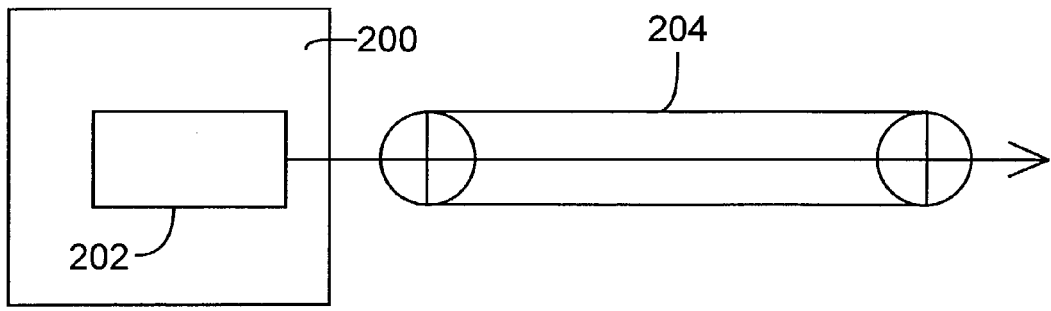
FIG. 2 is a schematic block diagram of a transmitter module that includes an equalizer and that is configured to drive a cable or other transmission line.

With reference to FIG. 2, a circuit board 200 includes an equalizer 202 in electrical communication with a cable 204 or a transmission line such as a coplanar waveguide, coplanar stripline, or other waveguide or transmission structure defined on the circuit board 200. The equalizer 202 can be configured to compensate or partially compensate frequency dependent losses or distortions, or other losses and distortions.

Figure 3A:
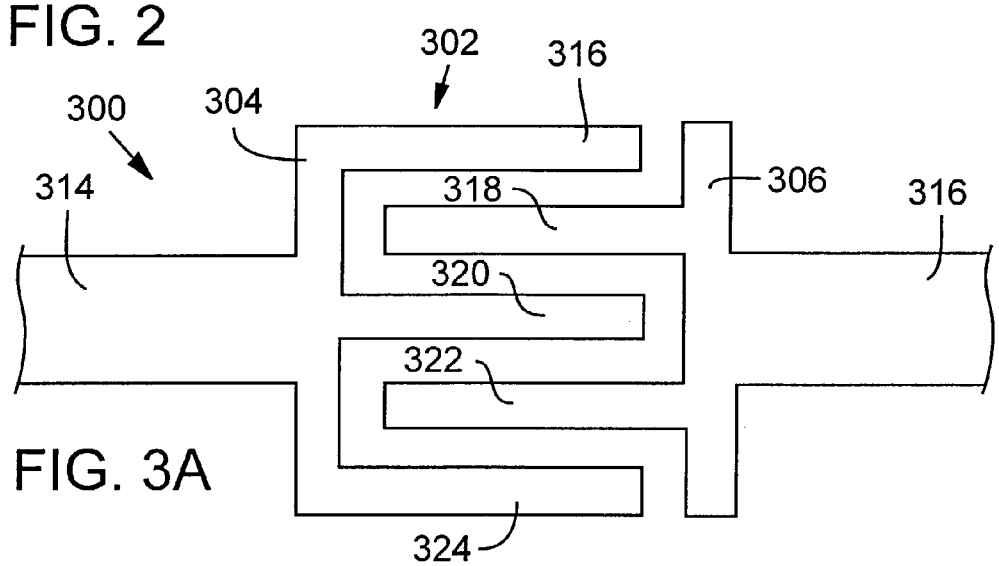
FIGS. 3A–3B are a partial plan view and a partial sectional view, respectively, of an interdigitated electrode compensator.
Figure 3B:
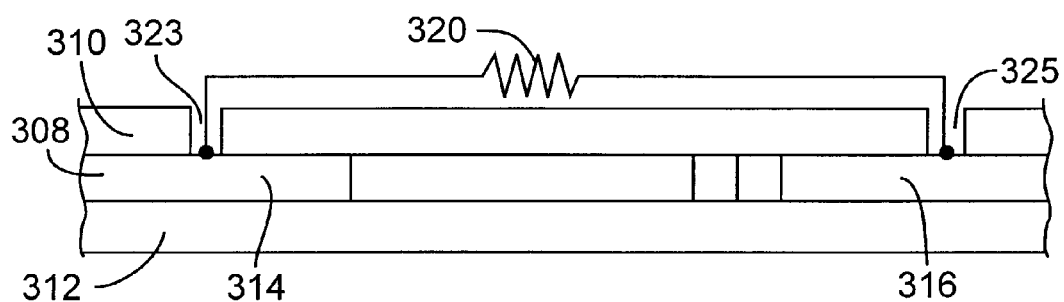

With reference to FIGS. 3A–3B, an equalizer 300 includes coplanar interdigitated capacitor 302 defined by interdigitated conductors 304, 306. The conductors 304, 306 are typically part of a layer 308 of a multilayer board that includes layers 310, 312, or more or fewer layers. Data signals are communicated to and from the interdigitated capacitor 302 on conductor portions 314, 316. Conductor digits 316, 318, 320, 322, 324 are configured to provide a selected capacitance value. For communication of data signals at bit rates of between about 3.125 Gb/s and 10 Gb/s, the capacitance is desirably selected to be between about 0.5 and 2.0 pF, or between about 0.1 pF and 10 pF for other data rates. At higher data rates, smaller values of capacitance are generally preferable. In a representative example, a value of 0.75 pF is selected. A capacitance value can be selected based on data rate, magnitude of dielectric loss, and/or type of dielectric.

While the interdigitated capacitor 302 provides compensation, equalization, or other correction of signal defects such as frequency dependent loss for high frequency signal components, lower signal frequencies can be attenuated using only capacitive coupling between the conductors 314, 316. Accordingly, to obtain satisfactory transmission and reception of lower frequency components, a resistor 320 is electrically connected to the conductors 314, 316 through vias 323, 325 provided in the layer 310. A resistance value associated with the resistor 320 can be selected based on an amount of correction needed or based on other factors, and typically a resistance value of between about 10 Ohms and 1000 Ohms is selected. In additional examples, the interdigitated capacitor 302 can be defined with conductors on an exterior layer so that a resistor can be electrically connected to the conductors without vias. In further examples, a resistor can be provided between the conductor digits as, for example, as a suitably configured conductor strip.

Figure 4A:
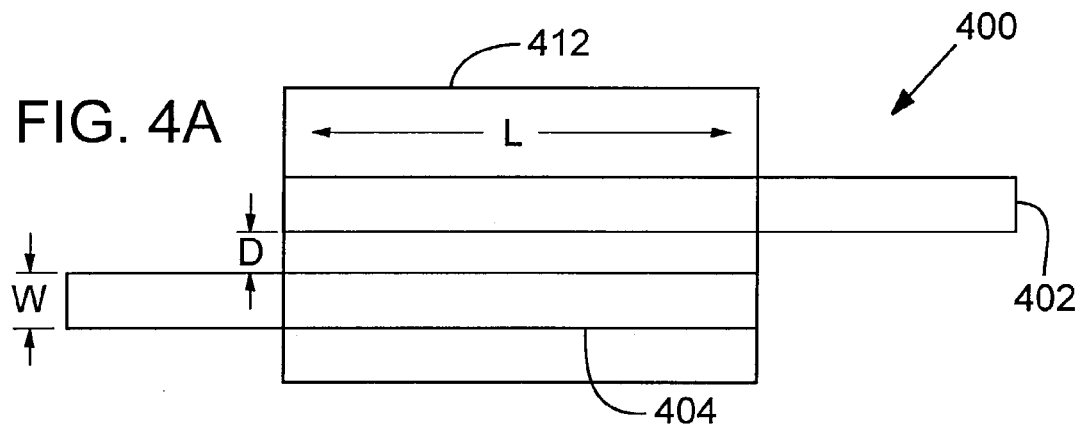
FIGS. 4A–4B are a partial plan view and a partial sectional view, respectively, of an equalizer that includes a coplanar capacitor.
Figure 4B:
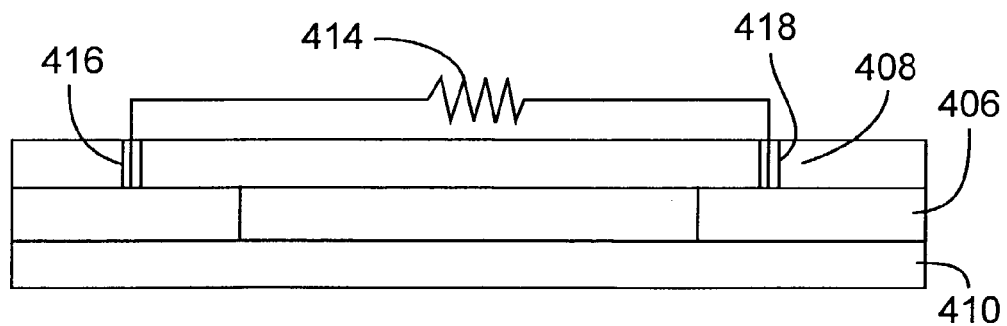

With reference to FIGS. 4A–4B, a coplanar coupler 400 configured as an equalizer or compensator includes a first conductor 402 and a second conductor 404 that are defined in a layer 406 of a multilayer circuit board or other substrate. In the example embodiment of FIGS. 4A–4B, the layer 406 is situated between additional layers 408, 410, but fewer or additional layers can be included. An overlap region 412 of the first conductor 402 and the second conductor 404 is configured based on a predetermined capacitance value, typical between about 0.1 pF and 20 pF. An overlap region length L, a conductor separation D, and a conductor width W can be selected based on the predetermined capacitance value. The conductors 402, 404 are shown as having substantially the same width, but conductors of different widths or shapes can be used.

While a capacitor can serve as an equalizer or compensator, superior performance for signals that include low frequency components can be obtained with compensators that include a resistor 414 that connects to the conductors 402, 404 through vias 416, 418. The resistor 414 can be connected to portions of the conductors 402, 404 that are in or out of the overlap region 412. The resistor 414 can also be defined with a conductor strip on the layer 408 or other layer.

Figure 5A:
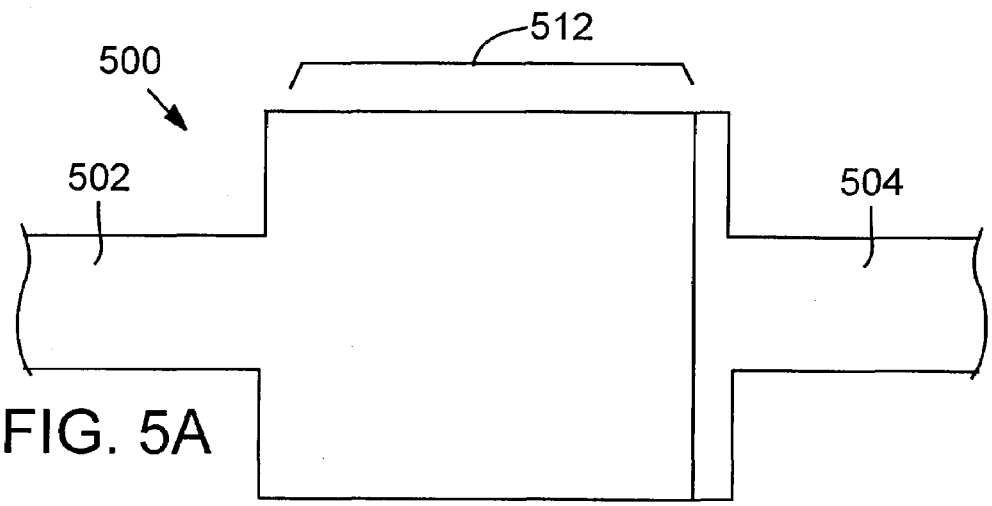
FIGS. 5A–5B are a partial plan view and a partial sectional view, respectively, of an equalizer that includes a parallel plate capacitor.
Figure 5B:
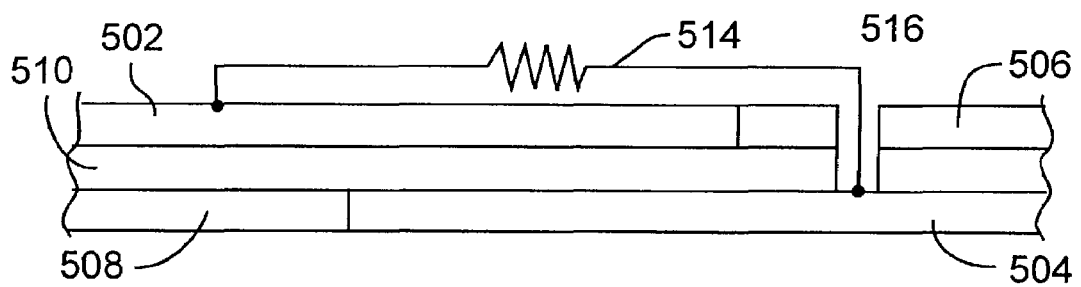

With reference to FIGS. 5A–5B, a parallel plate compensator 500 includes a first conductor 502 and a second conductor 504 in a first layer 506 and a second layer 508, respectively, of a multilayer circuit board. A dielectric layer 510 separates the first layer 506 and the second layer 508. A capacitance value associated with the compensator 500 can be selected based on conductor dimensions, dielectric layer thickness and dielectric constant, and a conductor overlap region 512. A resistor 514 can be configured to interconnect the conductors 502, 504 using a via 516.

Figure 6A:
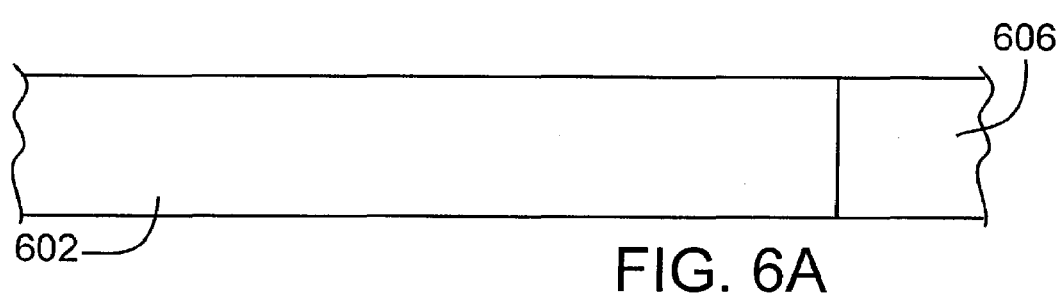
FIGS. 6A–6B are a partial plan view and a partial sectional view, respectively, of an equalizer that includes capacitor formed with traces on different layers of a multilayer circuit board.
Figure 6B:
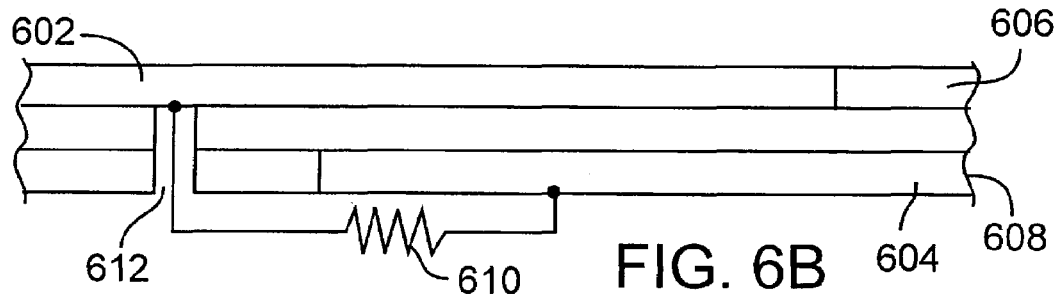

With reference to FIGS. 6A–6B, a first conductor 602 and a second conductor 604 are defined in respective layers 606, 608 of a multilayer circuit board. Dimensions and separations of the conductors 602, 604 can be configured to obtain a selected capacitance value and a resistor 610 can be situated to interconnect the conductors 602, 604 through a via 612. In such a configuration the first conductor 602 and the second conductor 604 can be displaced, opposite, or otherwise arranged.

Compensation or correction systems can be selected for a particular application based on, for example, a circuit board material and a total propagation length on conductors situated on the circuit board material. While dielectric losses associated with a selected material can be calculated based on material parameters such as loss tangent, such losses can be measured using a characterization system such as, for example, a vector network analyzer. Compensation of such losses can be evaluated using a characterization system 700 illustrated in FIG. 7. The system 700 includes a data generator 702, typically a pseudo-random sequence generator or other signal generator that produces a data stream having suitable frequency content, and an array 704 of compensators 706, 708, 710. A signal evaluator 712 such as a bit error rate calculator, a signal analyzer configured to display eye diagrams, or other signal measurement apparatus is situated to receive the data signal from the array 704. A clock signal output 714 of the signal generator 702 is generally connected to clock or trigger input 716 of the signal evaluator 712 but in some examples a clock signal is recovered directly from the data signal. Based on measured error rate (or eye opening) as a function of compensation, a material loss can be estimated so that compensators for arbitrary conductor configurations can be selected.

The system 700 uses an array of compensators but in other examples a single compensator can be used with a series of transmission lines of different lengths that include the dielectric (and therefore having different total dielectric losses), and material parameters determined based on a selection of a matching length or from a measurement of signal quantity as a function of transmission line length.

With reference to FIG. 8, a communication test system 800 includes a data generator 802 that delivers a data signal to a receiver/transmitter module 804. The module 804 includes a transmitter 806, a backplane interconnect 808, and a receiver 810. The data signal from the receiver/transmitter module 804 is delivered to a signal analyzer 812. In order to evaluate the receiver transmitter module 804, a clock signal is delivered from a clock output 814 of the data generator 802 to a clock input 816 of the signal analyzer 812. The backplane interconnect is provided with a compensator 818.

Figure 9A:
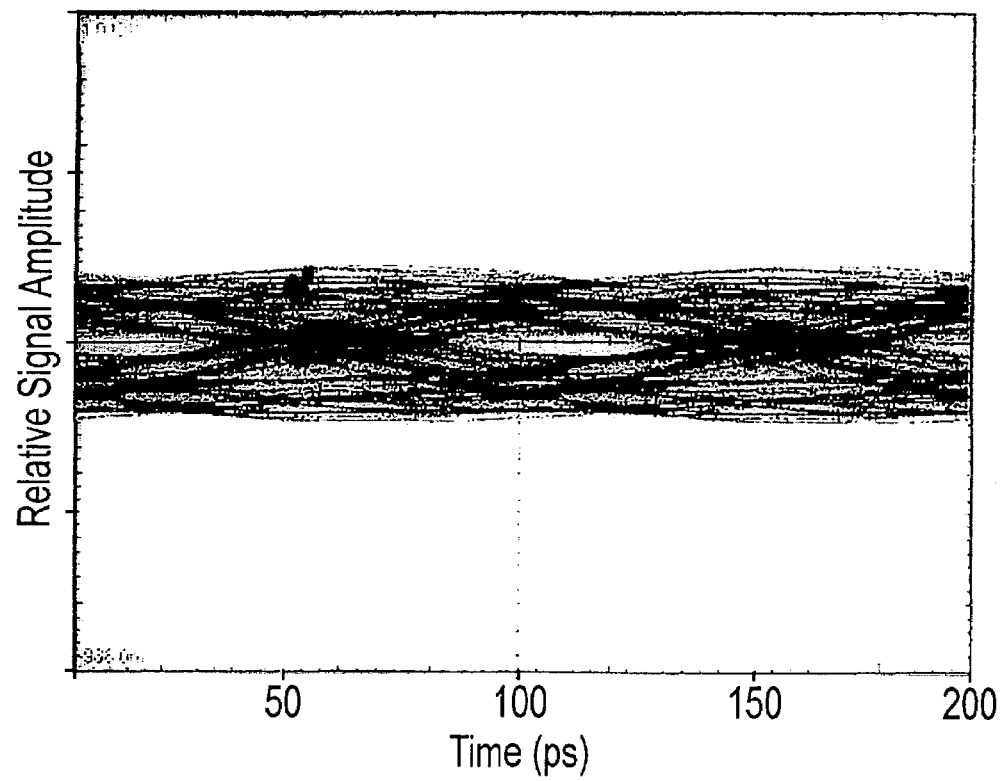
FIGS. 9A–9B are eye diagrams associated with received data signals without and with an interdigitated electrode compensator similar to that of FIGS. 3A–3B, respectively.
Figure 9B:
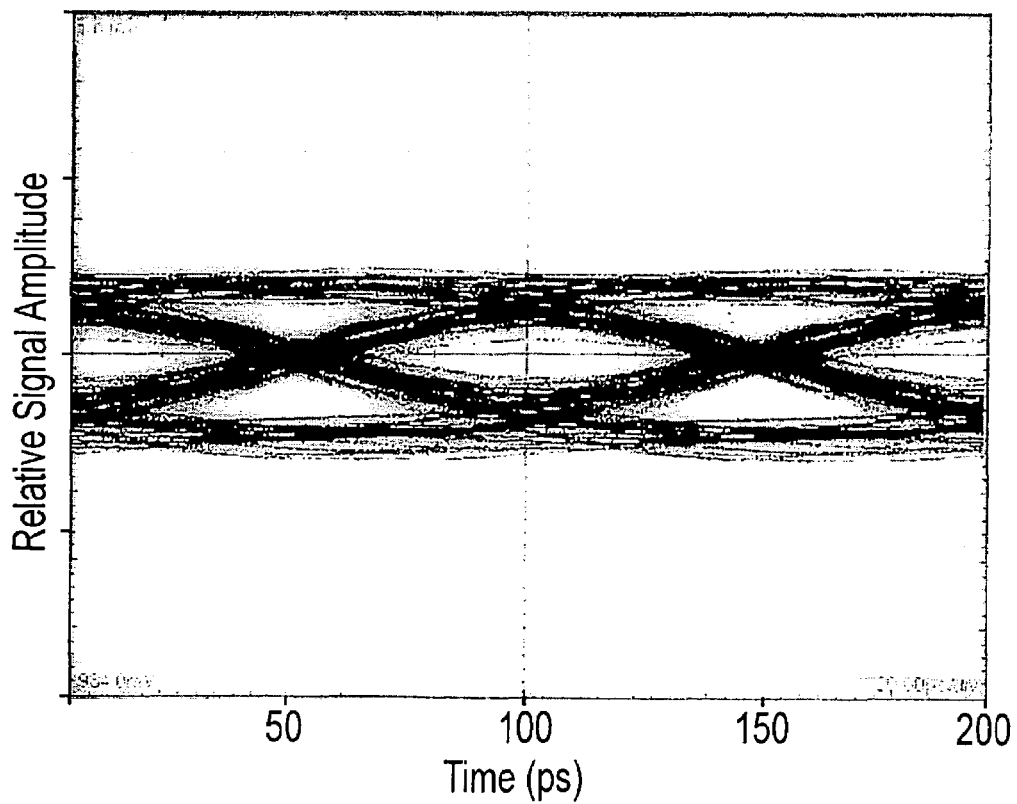

Eye measurements using the system of FIG. 8 for a bit rate of about 10.0 Gb/s are shown in FIGS. 9A–9B. The eye measurements of FIG. 9A were obtained without the compensator 818 and the eye measurements of FIG. 9B were obtained with the compensator 818. Both eye measurements include an effective backplane transmission length of 20 inches on an FR4 epoxy circuit substrate. The eye diagram of FIG. 9B is associated with an interdigitated electrode compensator having a capacitance of about 0.75 pF and a series resistance of about 100 Ohms. As is readily apparent, the eye opening associated with the compensated data signal is larger than that of the uncompensated signal and is approximately the same as the eye opening associated with the data signal produced by the data generator 802.

With reference to FIG. 10, a compensator is provided in a circuit board that includes layers 1002, 1004, 1006, 1008, 1010. The layer 1002 is a trace layer configured for communication of a data signal and is electrically connected to the ground plane layer 1008 with a conductor 1014 situated in a via 1012. In a representative embodiment, the conductor 1014 is selected to provide an inductance of about 1 nH.

Figure 11A:
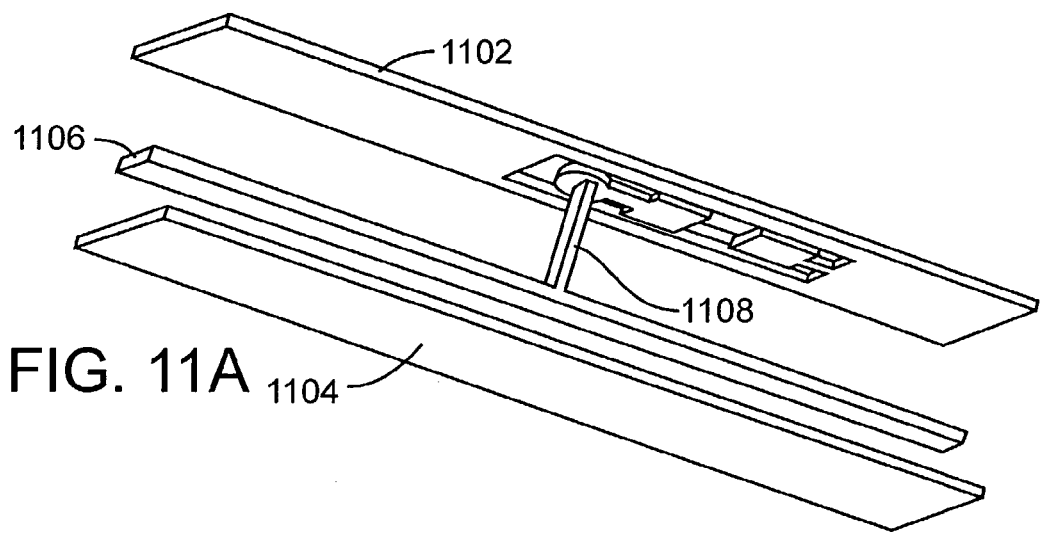
FIGS. 11A–11B are perspective views of an additional embodiment of an equalizer that includes an inductor.
Figure 11B:
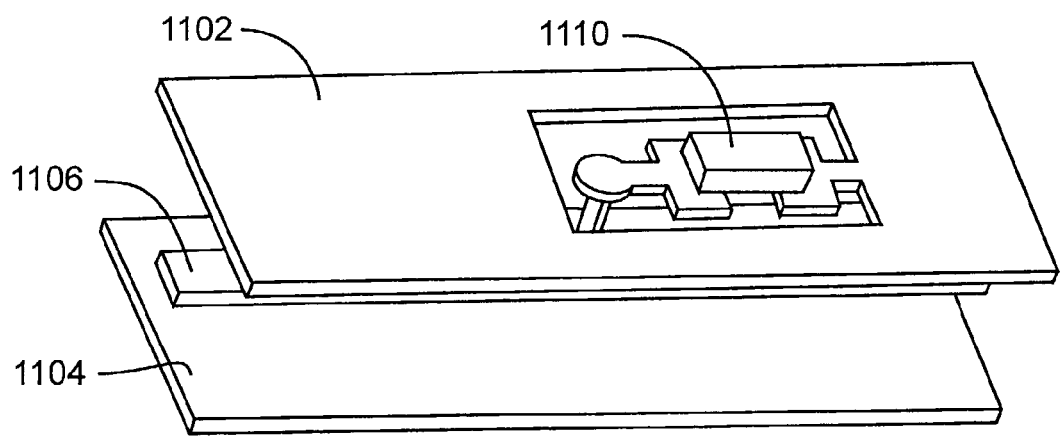
Figure 12:
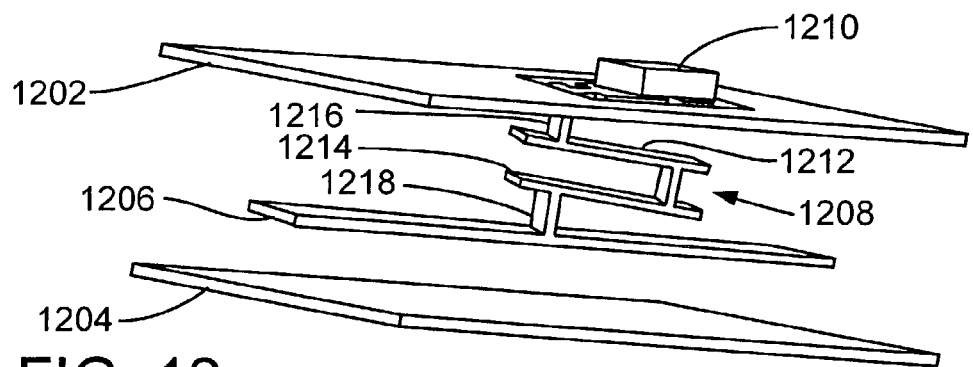
FIG. 12 is a perspective view of an additional embodiment of an equalizer that includes an inductor.

With reference to FIGS. 11A–11B, a multilayer circuit board includes ground plane conductors 1102, 1104 and a signal trace 1106 that is electrically connected to the ground plane 1102 with an inductor 1108 and a capacitor 1110. For convenience, dielectric layers are not shown. The inductor 1108 can extend through one or more board layers through a via (not shown in FIGS. 11A–11B). Capacitance and inductance values are selected based on a frequency dependent loss to be corrected or compensated. FIG. 12 illustrates an alternative configuration in which an inductor 1208 electrically connects a signal trace 1206 to a ground plane electrode 1202 through a capacitor 1210. The inductor 1208 includes inductor sections 1212, 1214 that are provided on different circuit board layers (or in vias) and connections to the board layers are provided by conductors 1216, 1218 that are situated in corresponding vias (not shown in FIG. 12). In other examples, an inductor can be defined on one or more layers and a resistor can be provided on or between one or more layers.

FIGS. 13A–17B illustrate eye diagrams obtained with data signals at bit rates of 3.125 Gb/s, 5 Gb/s, and 10 Gb/s propagating on 21 inch or 30 inch long traces defined on an FR4 circuit board. FIGS. 13A, 14A, 15A, 16A, 17A contain eye diagrams obtained without dielectric loss compensation and FIGS. 13B, 14B, 15B, 16B, 17B contain eye diagrams obtained with dielectric loss compensation based on an interdigitated capacitor.

Figure 18A:
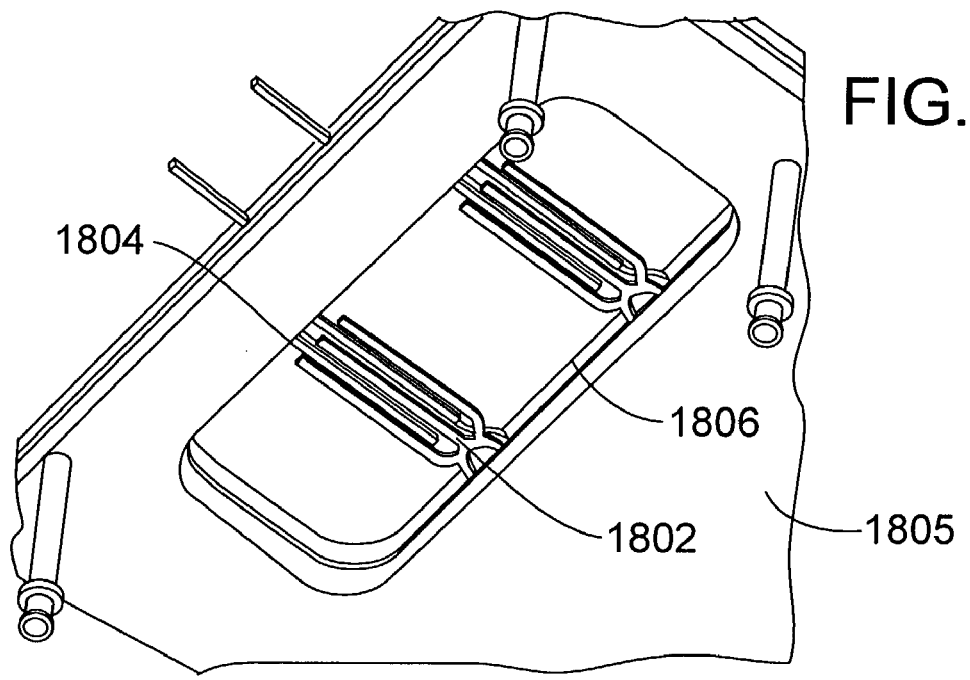
FIGS. 18A–18B are various views of a multilayer board that includes an interdigitated capacitor compensator.
Figure 18B:
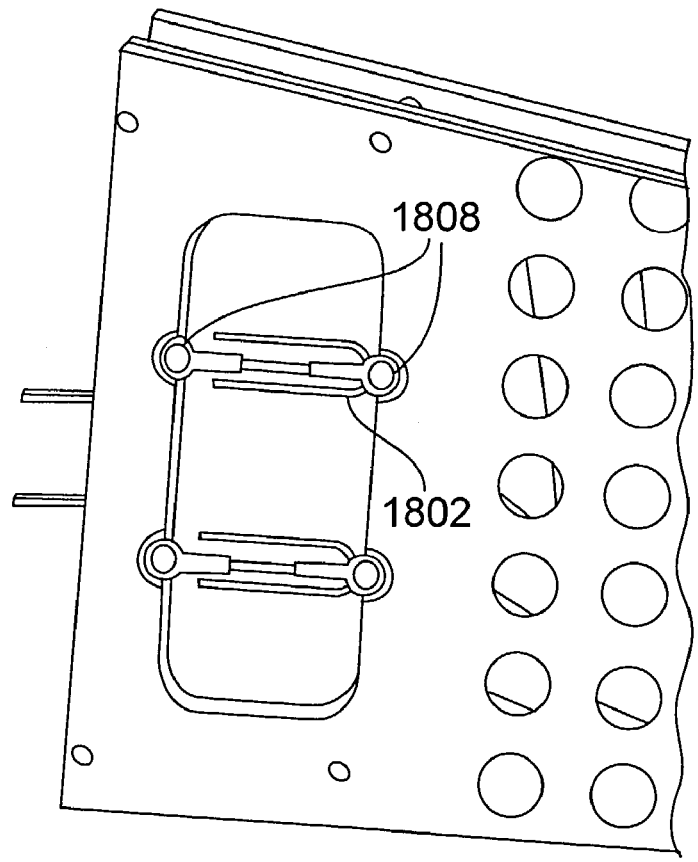

With reference to FIGS. 18A–18B, interdigitated electrodes 1802, 1804 are formed in a multilayer circuit board 1805. For purposes of illustration, a cutaway region 1806 is provided to display the multilayer structure of the circuit board 1805. Bond pads 1808 are configured for attachment of a series resistor or other component.

It will be apparent to those skilled in the art that the examples embodiments can be modified in arrangement and detail without departing from the principles of the invention. For example, capacitors and inductors defined in multilayer boards can be configured to compensate other frequency dependent losses such as, for example, skin effect losses. In addition, example embodiments are described with reference to predistorting, compensating, or other processing of digital data signals, but analog signals can be similarly predistorted, compensated, or processed. Such processing generally provides superior results for analog signals having appreciable high frequency components. We claim all that is encompassed by the appended claims.

We claim:

1. A method of modifying a digital signal passing along a signal trace from an input to an output of the trace to compensate for dielectric signal losses, the method comprising:
    evaluating the dielectric losses expected to be incurred in a digital signal which traverses the signal trace from the input to the output; and
    passively distorting the digital signal at least at one location along the trace in accordance with the evaluated dielectric losses to produce a digital signal at the output of the trace which is an amplitude reduced substantial replica of the digital signal at the input of the trace, wherein the act of passively distorting a signal at the at least one location along the trace comprises the act of electrically interconnecting the first and second sections of the signal trace with a resistive shunt and capacitively coupling a first section of the trace to a second section of the trace at the at least one location.

2. A method of compensating for dielectric losses in electrical signals traveling along a signal transmission path in a plural layered printed circuit board, the signal transmission path having an input and an output and being positioned in at least one layer of the printed circuit board, the method comprising:
    providing first and second sections of the transmission path;

positioning a capacitor in series with the first and second sections of the transmission path and in at least one layer of the printed circuit board to couple the first section of the transmission path to the second section of the transmission path; and providing a resistive shunt which electrically connects the first section to the second section to provide a capacitor bypass path for low frequency components of the digital signals.

3. A method according to claim 2 comprising the act of providing at least two vias positioned to electrically couple the resistive shunt to the first and second sections.

4. A method according to claim 3 in which the resistive shunt is supported the printed circuit board.

5. A method according to claim 3 in which the printed circuit board comprises at least one electrical component supporting surface and wherein the act of providing a resistive shunt comprises mounting the resistive shunt to the electrical component supporting surface.

6. A method of modifying a digital signal passing along a signal trace from an input to an output of the trace to compensate for dielectric signal losses, the method comprising:

evaluating the dielectric losses expected to be incurred in a digital signal which traverses the signal trace from the input to the output; and passively distorting the digital signal at least at one location along the trace in accordance with the evaluated dielectric losses to produce a digital signal at the output of the trace which is an amplitude reduced substantial replica of the digital signal at the input of the trace, wherein the act of passively distorting the signal at a location along the trace comprises the act of connecting at least one inductor from the trace to an electrical ground plane.

7. A method according to claim 6 in which the at least one inductor has a value of from about 1 nH to about 2 nH.

8. A method according to claim 7 in which the at least one location is adjacent to the input of the signal trace.

9. A method according to claim 6, further comprising connecting at least one resistor in series with the at least one inductor.

10. A multilayered electronic circuit defining at least one signal transmission path comprising an input and an output, the circuit comprising:

signal source means for delivering a high frequency digital signal to the input;

signal receiver means for receiving the digital signal from the output;

means for introducing distortion into the digital signal as it travels from the input to the output to compensate for dielectric losses, wherein the multilayered electronic circuit comprises a plural layered printed circuit board and wherein at least a portion of the transmission path and the means for introducing distortion is included in at least one layer of the printed circuit board; and wherein said means for introducing distortion comprises resistor means electrically connecting said first and second transmission path sections in parallel with at least one capacitor.

11. An apparatus for compensating for dielectric losses in digital signals comprising:

a plural layered electronic circuit comprising at least one digital signal transmission path comprising first and second transmission path sections positioned in at least one layer of the electronic circuit, the digital signal path comprising an input at which digital signals are received and an output from which digital signals which have traveled along the digital signal path are delivered;

a dielectric loss compensator coupled to the digital signal transmission path and incorporated at least partially in a layer of the electronic circuit, the dielectric loss compensator being operable to alter a digital signal traveling along the transmission path to provide a digital signal at the output which is a substantial replica of the digital signal at the input, wherein the dielectric loss compensator comprises at least one capacitor in series with the first and second transmission path sections so as to capacitively couple the first section of the transmission path to the second section of the transmission path; and a resistive shunt electrically connecting the first transmission path section to the second transmission path section such that low frequency components of digital signals passing along the transmission path bypass the at least one capacitor.

12. An apparatus according to claim 11 wherein the electronic circuit comprises at least two vias electrically connecting the resistive shunt to the first and second transmission path sections.

13. An apparatus according to claim 12 wherein the electronic circuit comprises a printed circuit board which comprises a backplane and wherein the resistive shunt is supported by the backplane of the printed circuit board.

14. An apparatus according to claim 12 in which the printed circuit board comprises at least one electrical component supporting surface and wherein the resistive shunt is mounted to the electrical component supporting surface.

* * * * *